United States Patent
Wu et al.

(10) Patent No.: US 7,906,174 B1
(45) Date of Patent: Mar. 15, 2011

(54) PECVD METHODS FOR PRODUCING ULTRA LOW-K DIELECTRIC FILMS USING UV TREATMENT

(75) Inventors: Qingguo Wu, Vancouver, WA (US); Easwar Srinivasan, Beaverton, OR (US); Dan Vitkavage, Tualatin, OR (US)

(73) Assignee: Novellus Systems, Inc., San Jose, CA (US)

( * ) Notice: Subject to any disclaimer, the term of this patent is extended or adjusted under 35 U.S.C. 154(b) by 858 days.

(21) Appl. No.: 11/608,056

(22) Filed: Dec. 7, 2006

(51) Int. Cl.
*C23C 16/00* (2006.01)

(52) U.S. Cl. .............. 427/248.1; 427/255.28; 427/385.5; 438/778

(58) Field of Classification Search ............... 427/248.1, 427/255.28, 385.5; 438/778
See application file for complete search history.

(56) References Cited

U.S. PATENT DOCUMENTS

| | | |
|---|---|---|
| 3,983,385 A | 9/1976 | Troue |
| 4,357,451 A | 11/1982 | McDaniel |
| 4,391,663 A | 7/1983 | Hutter, III |
| 4,563,589 A | 1/1986 | Scheffer |
| 4,837,185 A | 6/1989 | Yau et al. |
| 4,885,262 A | 12/1989 | Ting et al. |
| 5,178,682 A | 1/1993 | Tsukamoto et al. |
| 5,268,320 A | 12/1993 | Holler et al. |
| 5,282,121 A | 1/1994 | Bornhorst et al. |
| 5,504,042 A | 4/1996 | Cho et al. |
| 5,582,880 A | 12/1996 | Mochizuki et al. |
| 5,686,054 A | 11/1997 | Barthel et al. |
| 5,700,844 A | 12/1997 | Hedrick et al. |
| 5,789,027 A | 8/1998 | Watkins et al. |
| 5,840,600 A | 11/1998 | Yamazaki et al. |
| 5,851,715 A | 12/1998 | Barthel et al. |
| 5,858,457 A | 1/1999 | Brinker et al. |
| 5,876,798 A | 3/1999 | Vassiliev |
| 5,877,095 A | 3/1999 | Tamura et al. |
| 6,132,814 A | 10/2000 | Livesay et al. |
| 6,136,680 A | 10/2000 | Lai et al. |
| 6,140,252 A | 10/2000 | Cho et al. |
| 6,150,272 A | 11/2000 | Liu et al. |

(Continued)

FOREIGN PATENT DOCUMENTS

JP 01-107519 4/1989

(Continued)

OTHER PUBLICATIONS

Cho et al., "Plasma Treatments of Molecularly Templated Nanoporous Silica Films," Electrochemical and Solid-State Letters, 4 (4) G35-G38 (2001).

(Continued)

*Primary Examiner* — Binh X Tran
*Assistant Examiner* — Mahmoud Dahimene
(74) *Attorney, Agent, or Firm* — Weaver Austin Villeneuve & Sampson LLP (57) ABSTRACT

Methods of preparing low-k carbon-doped oxide (CDO) films having high mechanical strength are provided. The methods involve contacting the substrate with a CDO precursor to deposit the film typically using a plasma-enhanced chemical vapor deposition (PECVD) method. After the film is deposited, it is exposed to ultraviolet radiation in a manner that increases cross-linking and/or lowers the dielectric constant of the film. The resulting films have ultra-low dielectric constants, e.g., about 2.5, but also high mechanical strength, e.g., a modulus of at least about 7.5 GPa. In certain embodiments, a single hydrocarbon precursor is used, resulting in an improved process for obtaining ULK films that does not require dual (porogen and backbone) precursors.

23 Claims, 6 Drawing Sheets

U.S. PATENT DOCUMENTS

| | | |
|---|---|---|
| 6,228,563 B1 | 5/2001 | Starov et al. |
| 6,232,658 B1 | 5/2001 | Catabay et al. |
| 6,258,735 B1 | 7/2001 | Xia et al. |
| 6,268,288 B1 | 7/2001 | Hautala et al. |
| 6,270,846 B1 | 8/2001 | Brinker et al. |
| 6,271,273 B1 | 8/2001 | You et al. |
| 6,329,017 B1 | 12/2001 | Liu et al. |
| 6,340,628 B1 | 1/2002 | Van Cleemput et al. |
| 6,365,266 B1 | 4/2002 | MacDougall et al. |
| 6,365,528 B1 | 4/2002 | Sukharev et al. |
| 6,383,466 B1 | 5/2002 | Domansky et al. |
| 6,383,955 B1 | 5/2002 | Matsuki et al. |
| 6,386,466 B1 | 5/2002 | Ozawa et al. |
| 6,387,453 B1 | 5/2002 | Brinker et al. |
| 6,391,932 B1 | 5/2002 | Gore et al. |
| 6,392,017 B1 | 5/2002 | Chandrashekar |
| 6,394,797 B1 | 5/2002 | Sugaya et al. |
| 6,399,212 B1 | 6/2002 | Sakai et al. |
| 6,407,013 B1 | 6/2002 | Li et al. |
| 6,410,462 B1 | 6/2002 | Yang et al. |
| 6,413,583 B1 | 7/2002 | Moghadam et al. |
| 6,420,441 B1 | 7/2002 | Allen et al. |
| 6,436,824 B1 | 8/2002 | Chooi et al. |
| 6,444,715 B1 | 9/2002 | Mukherjee et al. |
| 6,465,366 B1 | 10/2002 | Nemani et al. |
| 6,467,491 B1 | 10/2002 | Sugiura et al. |
| 6,479,374 B1 | 11/2002 | Ioka et al. |
| 6,479,409 B2 | 11/2002 | Shioya et al. |
| 6,485,599 B1 | 11/2002 | Glownia et al. |
| 6,531,193 B2 | 3/2003 | Fonash et al. |
| 6,548,113 B1 | 4/2003 | Birnbaum et al. |
| 6,558,755 B2 | 5/2003 | Berry et al. |
| 6,563,092 B1 | 5/2003 | Shrinivasan et al. |
| 6,566,278 B1 | 5/2003 | Harvey et al. |
| 6,570,256 B2 | 5/2003 | Conti et al. |
| 6,572,925 B2 | 6/2003 | Zubkov et al. |
| 6,576,300 B1 | 6/2003 | Berry et al. |
| 6,596,654 B1 | 7/2003 | Bayman et al. |
| 6,610,362 B1 | 8/2003 | Towle |
| 6,632,478 B2 | 10/2003 | Gaillard et al. |
| 6,635,575 B1 | 10/2003 | Xia et al. |
| 6,644,786 B1 | 11/2003 | Leben |
| 6,662,631 B2 | 12/2003 | Baklanov et al. |
| 6,677,251 B1 | 1/2004 | Lu et al. |
| 6,713,407 B1 | 3/2004 | Cheng et al. |
| 6,740,602 B1 | 5/2004 | Hendriks et al. |
| 6,740,605 B1 | 5/2004 | Shiraiwa et al. |
| 6,756,085 B2 | 6/2004 | Waldfried et al. |
| 6,759,098 B2 | 7/2004 | Han et al. |
| 6,770,866 B2 | 8/2004 | Retschke et al. |
| 6,797,643 B2 * | 9/2004 | Rocha-Alvarez et al. .... 438/758 |
| 6,805,801 B1 | 10/2004 | Humayun et al. |
| 6,812,043 B2 | 11/2004 | Bao et al. |
| 6,815,373 B2 | 11/2004 | Singh et al. |
| 6,831,284 B2 | 12/2004 | Demos et al. |
| 6,835,417 B2 | 12/2004 | Saenger et al. |
| 6,848,458 B1 | 2/2005 | Shrinivasan et al. |
| 6,856,712 B2 | 2/2005 | Fauver et al. |
| 6,867,086 B1 | 3/2005 | Chen et al. |
| 6,884,738 B2 | 4/2005 | Asai et al. |
| 6,890,850 B2 | 5/2005 | Lee et al. |
| 6,903,004 B1 | 6/2005 | Spencer et al. |
| 6,914,014 B2 | 7/2005 | Li et al. |
| 6,921,727 B2 | 7/2005 | Chiang et al. |
| 6,958,301 B2 | 10/2005 | Kim et al. |
| 7,018,918 B2 | 3/2006 | Kloster et al. |
| 7,030,041 B2 | 4/2006 | Li et al. |
| 7,064,088 B2 | 6/2006 | Hyodo et al. |
| 7,087,271 B2 | 8/2006 | Rhee et al. |
| 7,094,713 B1 * | 8/2006 | Niu et al. ................ 438/795 |
| 7,098,149 B2 | 8/2006 | Lukas et al. |
| 7,132,334 B2 | 11/2006 | Lin |
| 7,148,155 B1 | 12/2006 | Tarafdar et al. |
| 7,166,531 B1 | 1/2007 | van den Hoek et al. |
| 7,176,144 B1 | 2/2007 | Wang et al. |
| 7,208,389 B1 | 4/2007 | Tipton et al. |
| 7,235,459 B2 | 6/2007 | Sandhu |
| 7,241,704 B1 | 7/2007 | Wu et al. |
| 7,247,582 B2 | 7/2007 | Stern et al. |
| 7,253,125 B1 | 8/2007 | Bandyopadhyay et al. |
| 7,265,061 B1 | 9/2007 | Cho et al. |
| 7,288,292 B2 | 10/2007 | Gates et al. |
| 7,326,444 B1 | 2/2008 | Wu et al. |
| 7,332,445 B2 | 2/2008 | Lukas et al. |
| 7,341,761 B1 | 3/2008 | Wu et al. |
| 7,381,659 B2 | 6/2008 | Nguyen et al. |
| 7,381,662 B1 | 6/2008 | Niu et al. |
| 7,390,537 B1 | 6/2008 | Wu et al. |
| 7,473,653 B1 | 1/2009 | Wu et al. |
| 7,481,882 B2 | 1/2009 | Won et al. |
| 7,504,663 B2 | 3/2009 | Yamazaki et al. |
| 7,510,982 B1 | 3/2009 | Draeger et al. |
| 7,611,757 B1 | 11/2009 | Bandyopadhyay et al. |
| 7,622,162 B1 | 11/2009 | Schravendijk et al. |
| 2001/0001501 A1 | 5/2001 | Lee et al. |
| 2001/0014512 A1 | 8/2001 | Lyons et al. |
| 2002/0001973 A1 | 1/2002 | Wu et al. |
| 2002/0016085 A1 | 2/2002 | Huang et al. |
| 2002/0034626 A1 | 3/2002 | Liu et al. |
| 2002/0064341 A1 | 5/2002 | Fauver et al. |
| 2002/0106500 A1 | 8/2002 | Albano et al. |
| 2002/0117109 A1 | 8/2002 | Hazelton et al. |
| 2002/0123240 A1 | 9/2002 | Gallagher et al. |
| 2002/0132496 A1 | 9/2002 | Ball et al. |
| 2002/0172766 A1 | 11/2002 | Laxman et al. |
| 2002/0195683 A1 | 12/2002 | Kim et al. |
| 2003/0013280 A1 | 1/2003 | Yamanaka |
| 2003/0064607 A1 | 4/2003 | Leu et al. |
| 2003/0068881 A1 | 4/2003 | Xia et al. |
| 2003/0111263 A1 | 6/2003 | Fornof et al. |
| 2003/0134038 A1 | 7/2003 | Paranjpe |
| 2003/0157248 A1 | 8/2003 | Watkins et al. |
| 2003/0203652 A1 | 10/2003 | Bao et al. |
| 2003/0224156 A1 | 12/2003 | Kirner et al. |
| 2003/0228770 A1 | 12/2003 | Lee et al. |
| 2004/0018319 A1 | 1/2004 | Waldfried et al. |
| 2004/0018717 A1 | 1/2004 | Fornof et al. |
| 2004/0023513 A1 | 2/2004 | Aoyama et al. |
| 2004/0029391 A1 | 2/2004 | Kirkpatrick et al. |
| 2004/0033662 A1 | 2/2004 | Lee et al. |
| 2004/0058090 A1 | 3/2004 | Waldfried et al. |
| 2004/0069410 A1 | 4/2004 | Moghadam et al. |
| 2004/0096593 A1 | 5/2004 | Lukas et al. |
| 2004/0096672 A1 | 5/2004 | Lukas et al. |
| 2004/0099952 A1 | 5/2004 | Goodner et al. |
| 2004/0101633 A1 | 5/2004 | Zheng et al. |
| 2004/0102031 A1 | 5/2004 | Kloster et al. |
| 2004/0161532 A1 | 8/2004 | Kloster et al. |
| 2004/0166240 A1 * | 8/2004 | Rhee et al. ............. 427/255.28 |
| 2004/0170760 A1 | 9/2004 | Meagley et al. |
| 2004/0185679 A1 | 9/2004 | Ott et al. |
| 2004/0213911 A1 | 10/2004 | Misawa et al. |
| 2004/0224496 A1 | 11/2004 | Cui et al. |
| 2004/0249006 A1 | 12/2004 | Gleason et al. |
| 2005/0025892 A1 * | 2/2005 | Satoh et al. ................ 427/385.5 |
| 2005/0064698 A1 | 3/2005 | Chang et al. |
| 2005/0064726 A1 | 3/2005 | Reid et al. |
| 2005/0095840 A1 | 5/2005 | Bhanap et al. |
| 2005/0112282 A1 | 5/2005 | Gordon et al. |
| 2005/0156285 A1 | 7/2005 | Gates et al. |
| 2005/0170104 A1 | 8/2005 | Jung et al. |
| 2005/0191803 A1 | 9/2005 | Matsuse et al. |
| 2005/0194619 A1 | 9/2005 | Edelstein et al. |
| 2005/0230834 A1 | 10/2005 | Schmitt et al. |
| 2005/0260357 A1 | 11/2005 | Olsen et al. |
| 2005/0260420 A1 * | 11/2005 | Collins et al. ................ 428/446 |
| 2005/0272220 A1 | 12/2005 | Waldfried et al. |
| 2006/0024976 A1 * | 2/2006 | Waldfried et al. ............ 438/778 |
| 2006/0027929 A1 | 2/2006 | Cooney et al. |
| 2006/0040507 A1 | 2/2006 | Mak et al. |
| 2006/0105106 A1 | 5/2006 | Balseanu et al. |
| 2006/0105566 A1 | 5/2006 | Waldfried et al. |
| 2006/0110931 A1 | 5/2006 | Fukazawa et al. |
| 2006/0118817 A1 | 6/2006 | Haisma |
| 2006/0145304 A1 | 7/2006 | Boyanov et al. |
| 2006/0145305 A1 | 7/2006 | Boyanov et al. |
| 2006/0178006 A1 | 8/2006 | Xu et al. |

| | | | |
|---|---|---|---|
| 2006/0220251 | A1 | 10/2006 | Kloster |
| 2006/0246672 | A1 | 11/2006 | Chen et al. |
| 2006/0260538 | A1 | 11/2006 | Ye et al. |
| 2007/0054504 | A1 | 3/2007 | Chen et al. |
| 2007/0132054 | A1 | 6/2007 | Arghavani et al. |
| 2007/0134907 | A1 | 6/2007 | Ikeda et al. |
| 2007/0275569 | A1 | 11/2007 | Moghadam et al. |
| 2007/0281497 | A1 | 12/2007 | Liu et al. |
| 2007/0287240 | A1 | 12/2007 | Chen et al. |
| 2008/0009141 | A1 | 1/2008 | Dubois et al. |
| 2008/0020591 | A1 | 1/2008 | Balseanu et al. |
| 2008/0132055 | A1 | 6/2008 | Nguyen et al. |
| 2008/0194105 | A1 | 8/2008 | Dominguez et al. |
| 2008/0199977 | A1 | 8/2008 | Weigel et al. |
| 2008/0305600 | A1 | 12/2008 | Liao et al. |
| 2009/0017640 | A1 | 1/2009 | Huh et al. |

FOREIGN PATENT DOCUMENTS

| | | |
|---|---|---|
| JP | 63-307740 | 12/2008 |
| KR | 2000-0043888 | 7/2000 |
| WO | WO 03/005429 A1 | 1/2003 |
| WO | WO 03/052794 A2 | 6/2003 |
| WO | 2006/104583 | 10/2006 |
| WO | 2006/127463 | 11/2006 |

OTHER PUBLICATIONS

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Justin F. Gaynor, "In-Situ Treatment of Low-K Films With a Silylating Agent After Exposure To Oxidizing Environments," U.S. Appl. No. 10/056,926, filed Jan. 24, 2002, 34 Pages.

Tipton et al., "Method Of Porogen Removal From Porous Low-K Films Using UV Radiation", Novellus Systems, Inc., U.S. Appl. No. 10/672,311, filed Sep. 26, 2003, pp. 1-27.

Jan, C.H., et al, 90NM Generation, 300mm Wafer Low k ILD/Cu Interconnect Technology, 2003 IEEE Interconnect Technology Conference.

Gangpadhyay et al., "The First International Surface Cleaning Workshop," Northeastern University, Nov. 11-14, 2002.

Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

Tipton et al., "Method Of Porogen Removal From Porous Low-K Films Using UV Radiation", U.S. Appl. No. 10/672,311, filed Sep. 26, 2003, Office Action dated Sep. 7, 2004.

Tipton et al., "Method Of Porogen Removal From Porous Low-K Films Using UV Radiation", U.S. Appl. No. 10/672,311, filed Sep. 26, 2003, Office Action dated Dec. 28, 2004.

Bandyopadhyay et al., "Method to Improve Mechanical Strength of Low-K Dielectric Film Using Modulated UV Exposure", U.S. Appl. No. 10/825,888, filed Apr. 16, 2004.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Niu et al., "Methods For Improving The Cracking Resistance Of Low-K Dielectric Materials", U.S. Appl. No. 10/860,340, Office Action dated Mar. 2, 2005.

Niu et al., "Methods For Improving The Cracking Resistance Of Low-K Dielectric Materials", U.S. Appl. No. 10/860,340, Final Office Action dated Jun. 13, 2005.

Varadarajan et al., "Tensile Dielectric Films Using UV Curing", U.S. Appl. No. 10/972,084, filed Oct. 22, 2004.

Draeger et al., "Creation Of Porosity in Low-K Films by Photo-Disassociation Of Imbedded Nanoparticles," U.S. Appl. No. 11/146,456, filed Jun. 6, 2005.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Office Action mailed Jul. 13, 2005, from U.S. Appl. No. 10/672,311.

U.S. Office Action mailed Dec. 20, 2005, from U.S. Appl. No. 10/672,311.

U.S. Office Action mailed Mar. 29, 2006, from U.S. Appl. No. 10/800,377.

Kelman et al., "Method for Reducing Stress in Porous Dielectric Films", U.S. Appl. No. 11/369,311, filed Mar. 6, 2006.

U.S. Office Action mailed Jun. 28, 2006, from U.S. Appl. No. 10/825,888.

U.S. Office Action mailed Dec. 27, 2006, from U.S. Appl. No. 10/825,888.

Cho et al., "Method and Apparatus for UV Exposure of Low Dielectric Constant Materials for Porogen Removal and Improved Mechanical Properties", Novellus Systems, Inc., U.S. Appl. No. 11/656,661, filed Jan. 22, 2007, pp. 1-28.

Shrinivasan et al., "Single-Chamber Sequential Curing of Semiconductor Wafers," Novellus Systems, Inc., U.S. Appl. No. 11/115,576, filed Apr. 26, 2005, pp. 1-29.

Kamian et al., "Ultra Violet Light Treatment Load Lock for Dielectric Films," Novellus Systems, Inc., U.S. Appl. No. 11/561,834, filed Nov. 20, 2006, pp. 1-25.

Schravendijk et al., "UV Treatment of Etch Stop and Hard Mask Films for Selectivity and Hermeticity Enhancement," Novellus Systems, Inc., U.S. Appl. No. 11/696,102, filed Apr. 3, 2007, pp. 1-22.

Tarafdar et al., "Sequential Deposition/Anneal Film Densification Method", Novellus Systems, Inc., filed Sep. 11, 2006, U.S. Appl. No. 11/519,445, pp. 1-37.

Schravendijk, "UV Treatment of FSG Films to Improve Film Stability," Novellus Systems, Inc., U.S. Appl. No. 11/622,423, filed Jan. 11, 2007, pp. 1-31.

Wu et al., U.S. Appl. No. 10/789,103, entitled: Methods for Producing Low-K CDO Films With Low Residual Stress.

Wu et al., U.S. Appl. No. 10/820,525, entitled: Methods for Producing Low-K CDO Films With Low Residual Stress.

Wu et al., U.S. Appl. No. 10/800,409, entitled: Methods for Producing Low-K CDO Films.

Fox et al., "Methods for Producing Low-Stress Carbon-Doped Oxide Films With Improved Integration Properties", U.S. Appl. No. 10/987,208, filed Nov. 12, 2004.

Wu et al., "Methods for Producing Low Stress Porous Low-K Dielectric Materials Using Precursors With Organic Functional Groups", U.S. Appl. No. 10/927,777, filed Aug. 27, 2004.

Wu et al., "Methods for Improving Integration Performance Of Low Stress CDO Films", U.S. Appl. No. 10/941,502, filed Sep. 14, 2004.

U.S. Office Action mailed Dec. 27, 2005, from U.S. Appl. No. 10/789,103.

U.S. Office Action mailed Dec. 23, 2005, from U.S. Appl. No. 10/800,409.

U.S. Office Action mailed May 31, 2006, from U.S. Appl. No. 10/941,502.

U.S. Office Action mailed Jun. 15, 2006, from U.S. Appl. No. 10/800,409.

U.S. Office Action mailed Jun. 14, 2006, from U.S. Appl. No. 10/789,103.

U.S. Office Action mailed Sep. 7, 2006, from U.S. Appl. No. 10/820,525.

U.S. Office Action mailed Nov. 30, 2006, from U.S. Appl. No. 10/927,777.

U.S. Office Action mailed Mar. 28, 2007, from U.S. Appl. No. 10/820,525.

U.S. Office Action mailed Jan. 24, 2007, from U.S. Appl. No. 10/789,103.

U.S. Office Action mailed Jun. 21, 2007, from U.S. Appl. No. 10/789,103.
U.S. Notice of Allowance and Fee Due mailed Dec. 19, 2006, from U.S. Appl. No. 10/800,409.
U.S. Office Action mailed Apr. 9, 2007, from U.S. Appl. No. 10/800,409.
Niu et al., "Methods for Improving the Cracking Resistance of Low-K Dielectric Materials," Novellus Systems, Inc., Appl. No. 11/376,510, filed Mar. 14, 2006, pp. 1-28.
U.S. Office Action dated May 22, 2007, from U.S. Appl. No. 11/376,510.
U.S. Notice of Allowance and Fee Due mailed Apr. 9, 2007, from U.S. Appl. No. 10/927,777.
Allowed Claims from U.S. Appl. No. 10/927,777.
U.S. Final Office Action mailed Apr. 3, 2007, from U.S. Appl. No. 10/941,502.
U.S. Notice of Allowance and Fee Due mailed Dec. 20, 2005, from U.S. Appl. No. 10/860,340.
Wu et al., "Methods for Improving Performance of ODC Films with Dielectric Constant <4.0," Novellus Systems, Inc., Appl. No. 11/693,661, filed Mar. 29, 2007, pp. 1-46.
Schravendijk, et al., "UV Treatment of STI Films for Stress," Novellus Systems, Inc., U.S. Appl. No. 11/811,048, filed Jun. 7, 2007.
Arghavani et al., *Strain Engineering in Non-Volatile Memories, Reed Business Information*, 2007, six page.
Notice of Allowance and Fee Due mailed May 22, 2006, from U.S. Appl. No. 10/672,311.
Allowed Claims from U.S. Appl. No. 10/672,311.
Notice of Allowance and Fee Due mailed Apr. 4, 2007, from U.S. Appl. No. 10/825,888.
Allowed Claims from U.S. Appl. No. 10/825,888.
Bandyopadhyay et al., "Method to Improve Mechanical Strength of Low-K Dielectric Film Using Modulated UV Exposure," Novellus Systems, Inc., U.S. Appl. No. 11/824,049, filed Jun. 28, 2007.
Notice of Allowance and Fee Due mailed Oct. 10, 2006, from U.S. Appl. No. 10/800,377.
Allowed Claims from U.S. Appl. No. 10/800,377.
U.S. Office Action mailed Nov. 28, 2007, from U.S. Appl. No. 10/807,680.
R.J. Lewis, Sr., Hawley's Condensed Chemical Dictionary, 12$^{th}$ Edition, Van Nostrad Reinhold Co., New York, 1993 (no month), excerpts pp. 916-918 & 1123-1124.
Notice of Allowance and Fee Due mailed Dec. 20, 2005, from U.S. Appl. No. 10/860,340.
Allowed Claims from U.S. Appl. No. 10/860,340.
U.S. Office Action mailed Dec. 12, 2007, from U.S. Appl. No. 11/146,456.
U.S. Office Action mailed Oct. 3, 2007, from U.S. Appl. No. 11/115,576.
Shaviv et al., "UV Treatment to Improve Integrity and Performance of Front End Dielectrics," Novellus Systems, Inc., U.S. Appl. No. 11/622,409, filed Jan. 11, 2007.
van Schravendijk et al., "UV Treatment for Carbon-Containing Low-K Dielectric Repair in Semiconductor Processing," Novellus Systems, Inc., U.S. Appl. No. 11/590,661, filed Oct. 30, 2006.
Shrinivassan et al., "Multi-Station Sequential Curing of Dielectric Films," Novellus Systems, Inc., U.S. Appl. No. 11/688,695, filed Mar. 20, 2007.
Varadarajan et al., "A Cascaded Cure Approach to Fabricate Highly Tensile Silicon Nitride Films," Novellus Systems, Inc., U.S. Appl. No. 11/897,838, filed Aug. 31, 2007.
Van den Hoek, et al., "VLSI Fabrication Processes for Introducing Pores Into Dielectric Materials," Novellus Systems, Inc., U.S. Appl. No. 11/606,340, filed Nov. 28, 2006.
U.S. Office Action mailed Jan. 10, 2008, from U.S. Appl. No. 11/622,423.
Bhadri Varadarajan et al., "Development of High Stress SiN Films for Use with Strained Silicon Technologies"; Proc. 68$^{th}$ Symp. On Semiconductors and IC Tech.; Kyoto 2005.
U.S. Notice of Allowance and Fee Due mailed Sep. 19, 2007, from U.S. Appl. No. 10/800,409.
Allowed Claims from U.S. Appl. No. 10/800,409.

U.S. Office Action dated Nov. 28, 2007, from U.S. Appl. No. 10/807,680.
R.J. Lewis, Sr., Hawley's Condensed Chemical Dictionary, 12$^{th}$ Edition, Van Nostrand Reinhold Co., New York, 1993 (no month), excerpts pp. 916-918 & 1123-1124.
U.S. Office Action mailed Oct. 4, 2007, from U.S. Appl. No. 10/820,525.
Wu et al., "Methods For Producing Low Stress Porous Low-K Dielectric Materials Using Precursors With Organic Functional Groups", U.S. Appl. No. 11/764,750, filed Jun. 18, 2007.
U.S. Office Action mailed Oct. 29, 2007, from U.S. Appl. No. 11/764,750.
Wu et al., Methods for Producing Low-K CDO Films, U.S. Appl. No. 11/936,754, filed Nov. 7, 2007.
Wu et al., "Methods For Improving Integration Performance of Low Stress CDO Films", U.S. Appl. No. 11/936,752, filed Nov. 7, 2007.
U.S. Notice of Allowance and Fee Due mailed Sep. 27, 2007, from U.S. Appl. No. 11/376,510.
Allowed Claims from U.S. Appl. No. 11/376,510.
U.S. Office Action mailed Apr. 3, 2008, from U.S. Appl. No. 10/982,654.
U.S. Office Action mailed Sep. 19, 2008, from U.S. Appl. No. 11/824,049.
U.S. Final Office Action mailed Jul. 10, 2008, from U.S. Appl. No. 10/807,680.
U.S. Final Office Action mailed Jul. 25, 2008, from U.S. Appl. No. 11/146,456.
U.S. Final Office Action mailed Jul. 9, 2008, from U.S. Appl. No. 10/982,654.
U.S. Office Action mailed May 14, 2008, from U.S. Appl. No. 11/519,445.
U.S. Final Office Action mailed May 2, 2008, from U.S. Appl. No. 11/115,576.
U.S. Office Action mailed Oct. 17, 2008, from U.S. Appl. No. 11/115,576.
U.S. Office Action mailed Jul. 23, 2008, from U.S. Appl. No. 11/622,423.
U.S. Appl. No. 11/590,661, Office Action mailed Apr. 6, 2009.
U.S. Appl. No. 11/811,048, Office Action mailed Mar. 19, 2009.
Rodriquez, J.A. et al., "Evolution of the mechanical stress on PECVD silicon oxide films under thermal processing", Journal of Materials Science Letters 19, 2000, pp. 1399-1401.
U.S. Appl. No. 11/606,340, Office Action mailed Feb. 5, 2009.
U.S. Appl. No. 11/824,049, Office Action mailed Mar. 19, 2009.
U.S. Appl. No. 10/982,654, Office Action mailed Dec. 4, 2008.
U.S. Appl. No. 11/519,445, Office Action mailed Dec. 10, 2008.
U.S. Appl. No. 10/972,084, Office Action mailed Dec. 30, 2008.
U.S. Appl. No. 11/115,576, Office Action mailed Apr. 22, 2009.
Draeger et al., "Creation of Porosity in Low-K Films by Photo-Disassociation Of Imbedded Nanoparticles," U.S. Appl. No. 12/369,384, filed Feb. 11, 2009.
U.S. Office Action mailed Sep. 7, 2004, from U.S. Appl. No. 10/672,311.
U.S. Office Action mailed Dec. 28, 2004, from U.S. Appl. No. 10/672,311.
U.S. Office Action dated Mar. 2, 2005, from U.S. Appl. No. 10/860,340.
U.S Final Office Action mailed Jun. 13, 2005, from U.S. Appl. No. 10/860,340.
U.S. Appl. No. 11/824,049, Notice of Allowance mailed Jun. 22, 2009.
U.S. Appl. No. 11/824,049, Allowed Claims.
U.S. Appl. No. 11/688,695, Office Action mailed Jun. 11, 2009.
U.S. Appl. No. 11/696,102, Office Action mailed Jul. 1, 2009.
Yu, J.J. et al., "UV Annealing of Ultrathin Tantalum Oxide Films", Applied Surface Science, V 186 (2002), 57-63.
U.S. Appl. No. 11/811,048, Notice of Allowance mailed Aug. 17, 2009.
U.S. Appl. No. 11/811,048, Allowed Claims.
U.S. Appl. No. 11/369,311, Office Action mailed Aug. 20, 2009.
P. Morin et al., "Tensile contact etch stop layer for nMOS performance enhancement: influence of the film morphology", ECS meeting, May 2005.

Takagi et al., "High Rate Deposition of a-Si:H and a-SiN$_x$:H by VHF PECVD", Vacuum, 51, 1998.

Smith, D.L et al., "Mechanism of SiN$_3$-SiH$_4$ Llasma", J. Electrochem. Soc., vol. 137 (2) 1990.

Nagayoshi et al., "Residual Stress of a Si$_{1-x}$N$_X$: H Films Prepared By Afterglow Plasma Chemical Vapor Deposition Technique", Jpn. J. Appl. Phys. vol. 31 (1992) pp. L867-L869 Part 2, No. 7A, Jul. 1, 1992.

Varadarajan et al., "Use of VHF RF plasma to deposit high tensile stress films with improved film properties for use in strained silicon technology", U.S. Appl. No. 11/975,473, filed Oct. 18, 2007.

U.S. Appl. No. 11/975,473, Office Action mailed Oct. 28, 2008.

U.S. Appl. No. 11/975,473, Office Action mailed Mar. 23, 2009.

Jiang et al., "Tensile dielectric films using UV curing", U.S. Appl. No. 11/899,683, filed Sep. 7, 2007.

U.S. Appl. No. 11/899,683, Office Action mailed May 29, 2009.

U.S. Appl. No. 11/519,445, Office Action mailed Aug. 26, 2009.

U.S. Appl. No. 11/622,409, Office Action mailed Jul. 1, 2009.

Haverkamp et al., "Enhancing adhesion of cap layer films", U.S. Appl. No. 11/731,581, filed Mar. 30, 2007.

U.S. Appl. No. 11/731,581, Office Action mailed Jun. 1, 2009.

U.S. Appl. No. 11/115,576, Office Action mailed Oct. 1, 2009.

U.S. Appl. No. 11/975,473, Office Action mailed Oct. 9, 2009.

Bandyopadhyay et al., "Method to Improve Mechanical Strength of Low-K Dielectric Film Using Modulated UV Exposure," Novellus Systems, Inc., U.S. Appl. No. 12/566,514, filed Sep. 24, 2009.

U.S. Appl. No. 11/622,409, Office Action mailed Nov. 5, 2009.

U.S. Appl. No. 11/519,445, Office Action mailed Nov. 4, 2009.

U.S. Appl. No. 10/972,084, Office Action mailed Nov. 27, 2009.

U.S. Notice of Allowance and Fee Due mailed Sep. 20, 2007, from U.S. Appl. No. 10/941,502.

Allowed Claims from U.S. Appl. No. 10/941,502.

U.S. Notice of Allowance and Fee Due mailed Feb. 11, 2008, from U.S. Appl. No. 10/789,103.

Allowed Claims from U.S. Appl. No. 10/789,103.

U.S. Office Action mailed Mar. 31, 2008, from U.S. Appl. No. 10/820,525.

U.S. Office Action mailed Aug. 5, 2008, from U.S. Appl. No. 10/987,208.

U.S. Final Office Action mailed May 29, 2008, from U.S. Appl. No. 11/764,750.

U.S. Notice of Allowance and Fee Due mailed Aug. 25, 2008, from U.S. Appl. No. 11/764,750.

Allowed Claims from U.S. Appl. No. 11/764,750.

Solomons and Fryhle, Organic Chemistry, 9$^{th}$ Edition, John Wiley & Sons, Inc., 2008, pp. 602-603.

Wu et al., Methods for Fabricating High Hardness/Modulus Low Dielectric Constant Materials, Novellus Systems, Inc., U.S. Appl. No. 11/369,658, filed Mar. 6, 2006.

Szekeres, A et al., "Plasma-assisted chemical vapor depositing silicon oxynitride as an alternative material for gate dielectric in MOS devices." Microelectronics Journal 37 (2006) pp. 64-70.

U.S. Final Office Action for U.S. Appl. No. 10/820,525 mailed Dec. 4, 2008.

U.S. Office Action for U.S. Appl. No. 11/369,658 mailed Dec. 12, 2008.

U.S. Office Action for U.S. Appl. No. 10/987,208 mailed Feb. 4, 2009.

U.S. Office Action for U.S. Appl. No. 11/936,754 mailed Jun. 19, 2009.

U.S. Final Office Action for U.S. Appl. No. 10/987,208 mailed Jul. 10, 2009.

U.S. Office Action for U.S. Appl. No. 11/369,658 mailed Jul. 8, 2009.

Haverkamp, et al., "Multi-Station Sequential Curing of Dielectric Films," Novellus Systems, Inc., U.S. Appl. No. 11/977,792, filed Oct. 25, 2007.

Haverkamp, et al., "Progressive UV Cure," Novellus Systems, Inc., U.S. Appl. No. 12/210,060, filed Sep. 12, 2008.

U.S. Office Action dated Jul. 10, 2008, from U.S. Appl. No. 10/807,680.

U.S. Office Action for U.S. Appl. No. 10/820,525 mailed Aug. 7, 2009.

U.S. Office Action for U.S. Appl. No. 11/693,661 mailed Aug. 28, 2009.

U.S. Supplemental Notice of Allowance and Fee Due mailed May 1, 2008, from U.S. Appl. No. 11/376,510.

Wu et al., "Methods for Producing Low Stress Porous Low-K Dielectric Materials Using Precursors With Organic Functional Groups", U.S. Appl. No. 12/348,791, filed Jan. 5, 2009.

Wu et al., "Methods for Producing Low Stress Porous Low-K Dielectric Materials Using Precursors With Organic Functional Groups", U.S. Appl. No. 12/479,114, filed Jun. 5, 2009.

Van Den Hoek, et al., "VLSI Fabrication Processes For Introducing Pores Into Dielectric Materials," Novellus Systems, Inc., U.S. Appl. No. 12/606,920, filed Oct. 27, 2009.

U.S. Notice of Allowance and Fee Due mailed Nov. 24, 2009, from U.S. Appl. No. 10/987,208.

Allowed Claims from U.S. Appl. No. 10/987,208.

* cited by examiner

PECVD METHODS FOR PRODUCING ULTRA LOW-K DIELECTRIC FILMS USING UV TREATMENT

FIELD OF THE INVENTION

This invention relates to methods for preparing dielectric films having low dielectric constants and high mechanical strength.

BACKGROUND

There is a general need for materials with low dielectric constants (low-k) in the integrated circuit manufacturing industry. Using low-k materials as the interlayer dielectric of conductive interconnects reduces the delay in signal propagation and signal crosstalk due to capacitive effects. The lower the dielectric constant of the dielectric, the lower the capacitance of the dielectric and the RC delay in the lines and signal crosstalk between electrical lines of the IC. Further, the use of low k materials as interlayer dielectrics will reduce power consumption of complex integrated circuits.

Low-k dielectrics are conventionally defined as those materials that have a dielectric constant (k) lower than that of silicon dioxide (SiO2), that is k<~4. Generally, they have a dielectric constant of 3 or less. Typical methods of obtaining low-k materials include introducing pores into the dielectric matrix and/or doping silicon dioxide with various hydrocarbons or fluorine. In technology nodes of 90 nanometers and beyond (e.g., 65 nanometers), carbon doped oxide dielectric materials look extremely promising. However, wide spread deployment of these materials in modern integrated circuit fabrication processes is hindered by increasing demands for high mechanical strength coupled with lower dielectric constants. For certain applications, it is now necessary to use dielectric materials having k values below about 2.7.

The International Technology Road Map for Semiconductors (ITRS) specifies that materials with dielectric constants (k) of 2.4 to 2.7 will be required for the 45 nm technology node. Plasma Enhanced Chemical Vapor Deposition (PECVD) carbon doped silicon oxide (CDO) is used for 90 nm and 65 nm technology nodes with k ranging between 2.8 and 3.2. Further reduction of the dielectric constant to below 2.7 is achievable through incorporation of additional methyl groups and/or free space. Typically, this is accomplished through co-deposition of a backbone precursor and a porogen. The porogen is driven out during a cure step, leaving the backbone and increased free space behind. This free space can lead to degraded mechanical properties of the film relative to fully dense materials. It also allows penetration of moisture and solvents during integration, potentially lowering the interconnect performance.

SUMMARY

The present invention provides methods of preparing low-k carbon-doped oxide (CDO) films having high mechanical strength. The methods involve contacting the substrate with a CDO precursor to deposit the film typically using a plasma-enhanced chemical vapor deposition (PECVD) method. After the film is deposited, it is exposed to ultraviolet radiation in a manner that increases cross-linking and/or lowers the dielectric constant of the film. The resulting films have ultra-low dielectric constants, e.g., about 2.5, but also high mechanical strength, e.g., a modulus of at least about 7.5 GPa. In certain embodiments, a single hydrocarbon precursor is used, resulting in an improved process for obtaining ULK films that does not require dual (porogen and backbone) precursors.

These and other features and advantages of the invention will be presented in more detail below with reference to the associated drawings.

DETAILED DESCRIPTION OF A PREFERRED EMBODIMENT

Introduction and Overview

The present invention relates to ultra low-k (ULK) CDO films, with significantly improved chemical and mechanical properties. The methods of the invention involve depositing CDO films via plasma enhanced chemical vapor deposition (PECVD) using a precursor having one or more functional groups. UV-assisted Thermal Processing (UVTP) is applied to produce ULK CDO films with desirable chemical bond and structure. In specific embodiments, the UVTP increases cross-linking and lower the dielectric constant of the deposited film.

Generally, CDO film refers to a material whose compositional elements include Si, O, C and H, which may be crosslinked to form the CDO matrix. It may contain traces of other elements, including fluorine (F) or germanium (Ge). "Ultra low-k", in the context of this invention means that the dielectric constant of the CDO layer is not greater than about 2.7. In particular embodiments, the CDO layer has a dielectric constant of about 2.5.

Insulating materials with ultra low dielectric constants are needed to minimize signal propagation delay, crosstalk and power consumption as inter-metal spacing decreases in advanced integrated interconnects. In order to meet these escalating performance demands, the industry has begun to replace $SiO_2$ and fluorinated silicate glass (FSG) with alternative dielectrics in full-scale production at the 90 nm and 65 nm technology nodes with CDO films deposited using PECVD, typically containing only carbon and hydrogen atoms in addition to silicon and oxygen atoms. Because they share many similarities with $SiO_2$ and FSG in composition and thermo-mechanical properties, PECVD CDO films offers an evolutionary approach to solving the low k IMD challenge.

The bulk dielectric constant (k) of CDO films being implemented at 90 nm typically ranges from 3.2 to as low as 2.85, which is significantly lower than those of $SiO_2$ (k~4.1) and FSG (k~3.6). As the k value lowers, the mechanical properties of dielectric films gradually degrade due to incorporation of more methyl (—$CH_3$) groups and free space. Many device failures can often be ultimately traced to the poor mechanical properties of the CDO films. The introduction of more free space, i.e., pores, within the film could result in a number of undesirable properties such as a reduction in mechanical strength and penetration of chemicals. The gas-phase precursors used during subsequent chemical vapor deposition or atomic layer deposition may have a tendency to infiltrate the porous dielectric. The penetration of metallic species or solvents during integration could damage the electric properties of the ULK dielectrics.

The challenge then is to create ultra-low k films having good mechanical strength and resistance to penetration by foreign species. Current methods of depositing ULK films typically require using two precursors—a backbone network former and a porogen. The backbone network former is typically a silicon-containing compound and the porogen a separate organic compound. The porogen is typically driven out with a cure process, leaving the backbone behind, thereby creating a porous dielectric film. Porogens are typically organic materials such as a polymers that typically exist as a separate phase from the backbone network former within the deposited precursor layer. The porogen is such that it is able to be removed from the deposited layer by the application of energy, e.g., heat, plasma, ultra-violet radiation, etc.

In certain embodiments, the methods of the present invention use a single precursor and hence eliminate the porogen removal step. Use of a single precursor and elimination of the porogen removal operation has advantages in certain applications~for example, out-gassing of species in the deposited film during subsequent operations is reduced, thereby easing integration. In addition, the single precursor films have improved chemical inertness relative to the dual precursor films as there is no organic porogen in the matrix; porogen-based films may contain unstable organic species that remain in the matrix. (For purposes of discussion, dual precursor films refers to films deposited with a backbone network former precursor and a porogen precursor as described above).

Importantly, the films produced by the methods of the present invention have performance comparable to the dual precursor films. For example, film having a k-value of 2.5 and a modulus of 7.5 GPa can be achieved using the single precursor methods of the present invention—film performance previously achievable only with the dual precursor methods. (Hardness and modulus are well defined within the art and will not be discussed in detail herein. Measures of film hardness and modulus presented herein may be made with any suitable apparatus including a nano-indentation device.)

Figure 1:
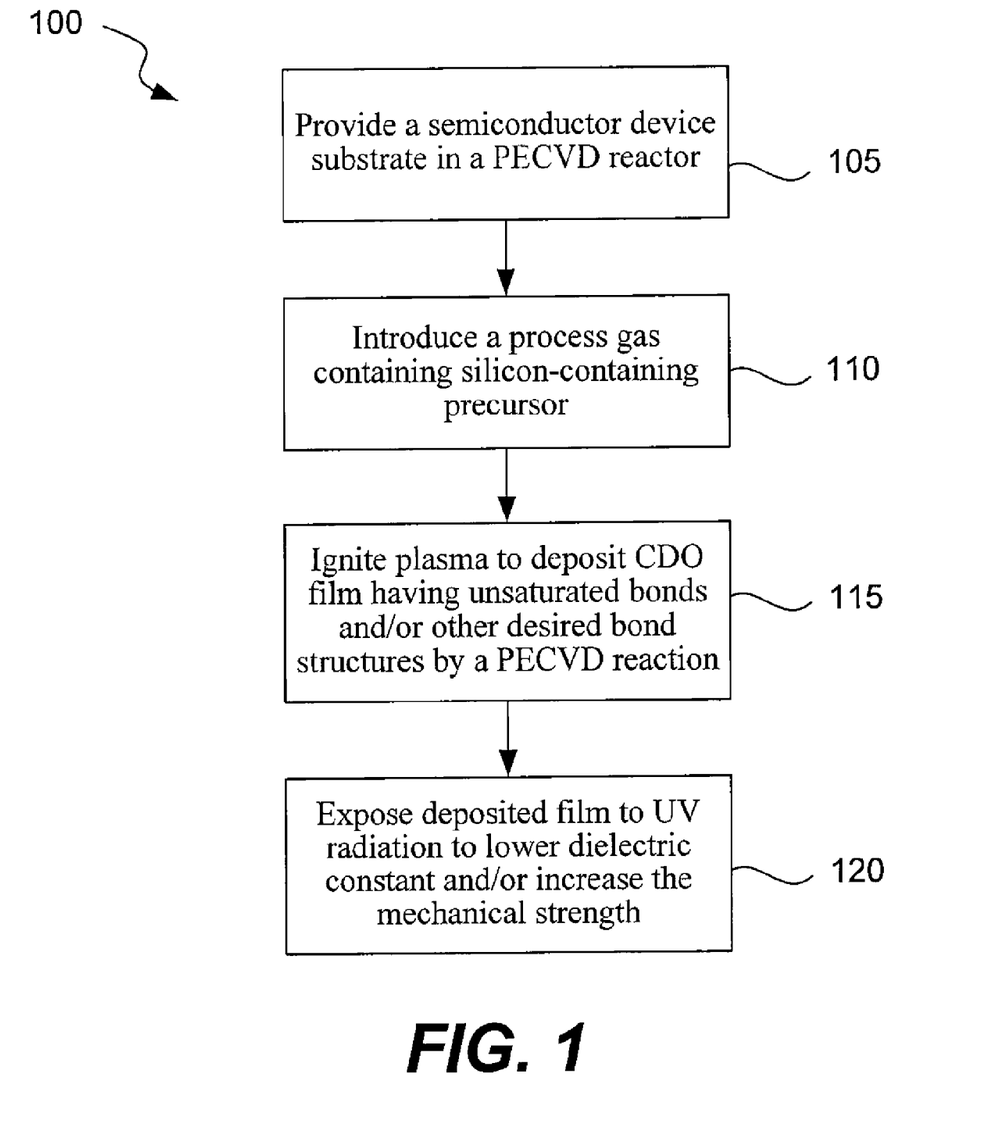
FIG. 1 is a flowchart illustrating the basic method for creating ultra low-k CDO dielectric layers with high hardness/modulus.

FIG. 1 is a flowchart illustrating a high level method for creating ultra low-k CDO dielectric layers with high hardness/modulus. The operations are described briefly here and in further detail below. First, in an operation 105a wafer is supplied to a PECVD reactor. In an operation 110, a single silicon-containing precursor is introduced in a process gas. Precursor selection has strong effects on the material properties of the film. Generally, precursors are chosen to have a high carbon content and one or more functional groups, including in some embodiments triple bonds. The process gas may also contain an oxidant and typically contains a carrier gas. Precursor selection is described further below. After process gas is introduced to the PECVD reactor, a plasma is ignited under conditions that promote incorporation of desired compositional bond structure in the CDO film in an operation 115. Process conditions for the PECVD deposition are described further below. Once the film is deposited to a desired thickness, the as-deposited film is exposed to UV radiation in an operation 120. This is typically a UV-assisted thermal processing (UVTP) operation, also discussed further below. The purpose of UV curing is increase mechanical strength, and in certain embodiments, lower the dielectric constant. Choice of the CDO precursor(s) is also important to this operation as UV radiation has different effects on different film compositions. For most CDO film compositions and/or under certain UV exposure conditions, dielectric constant may rise as a result of UV curing. It has been found, however, that UV cure is able to lower the k-value of CDO films deposited using certain precursors having carbon-carbon triple bonds, e.g., TMSA and BTMSA, and other functional groups as discussed below. Operation 120 may occur in the same chamber as the deposition if equipped with a UV source, or the wafer may be transferred to another chamber equipped with a UV source. Also, in certain embodiments, the PECVD/UVTP process may be repeated to produce an ultra low-k film of a certain thickness in stages.

PECVD processes for producing high quality, low-k films with high mechanical strength using precursors having unsaturated bonds is discussed in the following commonly-assigned U.S. patent applications, which are hereby incorporated by reference in their entireties and for all purposes: U.S. patent application Ser. Nos. 10/789,103 and 10/820,525, both titled "METHODS FOR PRODUCING LOW-K CDO FILMS WITH LOW RESIDUAL STRESS"; U.S. patent application Ser. No. 10/800,409, titled METHODS FOR PRODUCING LOW-K CDO FILMS; and U.S. patent application Ser. No. 10/941,502, titled "METHODS FOR IMPROVING INTEGRATION PERFORMANCE OF LOW STRESS CDO FILMS." The methods of this invention use a UV cure process to increase the mechanical strength. In addition to increasing the mechanical strength of the film, in certain embodiments, the UV cure process of the methods of the invention lowers the dielectric constant. In certain embodiments, dielectric constants lower than or equal to about 2.5 may be achieved using the methods of the invention. As indicated above, current technology to prepare ULK films uses two precursors—a backbone network former and a porogen. The porogen is typically driven out with a cure process, leaving the backbone behind. The methods of the present invention may be implemented using only a single CDO precursor without the need for a porogen removal step.

As discussed in above-referenced U.S. patent application Ser. No. 10/800,409, it has been found that rigid chemical bonds such as carbon-carbon triple bonds strengthen a solid's matrix and generate additional free space (a nanometer scale pore space), thereby lowering the k value of the solid's dielectric constant. The advantages gained by introducing these unsaturated groups can be understood as follows. There are four major structural configurations for carbon in CDO films. The tetrahedral $sp^3$ structure has the most degrees of freedom while the other three structures (the triangular $sp^2$ structure and linear sp structures —C≡ and =C=) have fewer degrees of freedom and thus have more rigidity. Due to the reactive nature of deposition process and carbon-carbon triple bonds, not only triple bonds themselves but also their derivative forms will be present in CDO films. These derivative forms result from the opening of one or two of the triple bond to form carbon-carbon double bond or carbon-carbon bond, and/or crosslinking to Si—O—Si network. The $sp^2$ and sp structures comprise C=C and C≡C bonds and have significantly different atom-atom of distance than C—C, C—O, Si—O, or Si—C bonds do. Nominal bond length of C—C bond is ~1.5 Angstroms, that of C≡C bond is ~1.3 Angstroms and that of CC bond is ~1.2 Angstroms, that of C—O bond is ~1.1 Angstroms while the nominal bond length of Si—O bond is ~1.6 Angstroms and that of Si—C bond is ~1.9 Angstroms. Because of their rigidity and bond lengths, the C═C or C≡C bonds (and their derivative forms) provide means to alter the Si—O—Si matrix structure and increase the nanometer scale pore space in the CDO matrix.

The deposition of CDO films using certain precursors containing unsaturated bonds results in low k films that also have high mechanical strength. It has been found that the addition of a post-deposition UVTP operation to the PECVD process described in that application improves cross-linking (thereby improving hardness and modulus) and lowers the dielectric constant.

Precursor Optimization

Both process optimization and precursor selection can have strong effects on the material properties of the film. Precursors of interest are generally carbon-rich organosilicon compounds containing functional groups such as Si—$C_xH_y$ (cyclic or linear), Si—$C_xH_yO_z$ (cyclic or linear), Si—CH═ (cyclic or linear) and Si—C≡ (cyclic or linear) groups. In particular, precursors containing triple bonds have been shown to produce ULK films having high modulus according to the methods of the invention.

Precursors having carbon-carbon triple bonds found in various classes of compound including, for example, silanes having at least one hydrocarbon group with a carbon-carbon triple bond and at least one alkyl group or at least one oxyhydrocarbon group, bis(alkylsilyl)acetylenes, bis(alkylsilyl)ethylenes, and siloxanes having pendant hydrocarbon groups with a carbon-carbon triple bond.

Several silicon-containing, C≡C containing, hydrocarbons (with or without oxygen) have been identified as precursors that may be used in a deposition process to form CDO films having low dielectric constants. These include the following:

Trimethylsilaneacetylene ($SiC_5H_{10}$): TMSA, also known as ethynyltrimethylsilane (ETMS), $(CH_3)_3Si$—C≡C—H Propargyltrimethylsilane ($SiC_6H_{12}$): PTMS, $(CH_3)_3Si$—$CH_2$—C≡C—H Propargyloxytrimethylsilane ($SiC_6H_{12}O$): POTMS, $(CH_3)_3Si$—O—$CH_2$—C≡C—H Bis(trimethylsilyl)acetylene ($Si_2C_8H_{18}$): BTMSA, $(CH_3)_3Si$—C≡C—$Si(CH_3)_3$ 1,3-Diethynyltetramethyldisiloxane ($Si_2C_8H_{14}O$): DTDS, HC≡C—$Si(CH_3)_2$—O—$Si(CH_3)_2$—C≡C—H Dimethylmethoxysilaneacetylene ($SiC_5H_{11}O$): DMMOSA, $(CH_3O)(CH_3)_2Si$—C≡CH Methyldimethoxysilaneacetylene ($SiC_5H_{11}O_2$): MDMOSA, $(CH_3O)_2(CH_3)Si$—C≡CH Dimethylethoxysilaneacetylene ($SiC_6H_{13}O$): DMEOSA, $(C_2H_5O)(CH_3)_2Si$—C≡CH Methyldiethoxysilaneacetylene ($SiC_7H_{15}O_2$): MDEOSA, $(C_2H_5O)_2(CH_3)Si$—C≡CH Ethyldiethoxysilaneacetylene ($SiC_8H_{17}O_2$): EDEOSA, $(C_2H_5O)_2(C_2H_5)Si$—C≡CH Dimethylsilane-diacetylene ($SiC_6H_8$): DMSDA, $(CH_3)_2Si(C$≡$CH)_2$ Methylsilane-triacetylene ($SiC_7H_6$): MSTA, $(CH_3)Si(C$≡$CH)_3$; and Tetraacetylene Silane ($SiC_8H_4$): TAS, $Si(C$≡$CH)_4$ The functional groups are C≡C (triple bonds), which may be pendant or embedded within other functionalities. During deposition, these special functional groups become integrated in the CDO film on the substrate. Rigid C≡C bonds, and their derivative bonding structures through crosslinking with Si, O, and C, when embedded in the CDO film, strengthen the material matrix and alter Si—O—Si backbone structure of CDO films, resulting in a more rigid lattice, thus lowering the tensile stress of the CDO film. As presented below, the incorporation of C═C and C≡C bond and their derivative forms within the Si—O—Si structure was observed by FTIR and other analytical methods. Such films may be formed from a single organosilicon containing precursor or multiple precursors in combination. If a single precursor is used, then it contains at least one carbon-carbon triple bond. Also, in certain embodiments, the functional groups are C═C bonds, contained in a single precursor if used. But if multiple precursors are used in combination, it is not necessary for each of them to include an unsaturated group. Various primary precursors may be employed which have no double bonds or triple bonds.

It should be noted that the use of multiple precursors is distinct from the "dual precursor"~backbone network former and porogen~methods used to deposit porous ULK films. As noted above, in certain embodiments, the methods of the present invention eliminate the need for a porogen removal operation. In some cases, a single hydrocarbon precursor (i.e., the organosilicon precursor) is used in the process gas. In certain embodiments, however, multiple organic precursors (e.g., multiple organosilicon precursors) none of which is a porogen, may also be used.

Examples of precursors having Si—$C_xH_y$ and/or Si—$C_xH_yO_z$ and/or Si—CH═functional groups include 3-(trimethylsilyl)cyclopentene, 1,3-Divinyltetramethyldisiloxane ($Si_2C_8H_{18}O$): DVDS, $H_2C$═CH—$Si(CH_3)_2$—O—$Si(CH_3)_2$—CH═$CH_2$, Vinylmethyldimethoxysilane ($SiC_5H_{12}O_2$): VMDEOS, $(CH_3O)_2(CH_3)Si$—CH═$CH_2$, Divinyldimethylsilane ($SiC_6H_{12}$): DVDMS, $(CH_3)_2Si(CH$═$CH_2)_2$, Phenoxytrimethylsilane and Phenyldimethylethoxysilane.

In addition to the CDO precursor(s), the process gas may also contain carrier gases and a source of oxygen (the oxygen source may also be used as the carrier gas). Generally, the carrier gas is provided in much greater volumes than the precursor gases. It is used as a delivery vehicle and a means for sweeping precursor materials and byproducts through the reactor. Various oxygen containing gases such as molecular oxygen ($O_2$), ozone ($O_3$), hydrogen peroxide ($H_2O_2$), nitrous oxide ($N_2O$) and carbon dioxide ($CO_2$) may be used. Carbon dioxide is preferred for many applications of this invention. In some embodiments hydrogen is used as the carrier gas. In still other embodiments, inert gases such as helium, argon, nitrogen, etc. are used.

In one example, the process gas employs a carrier gas but no separate oxygen source (e.g., molecular oxygen, ozone, hydrogen peroxide or carbon dioxide). Examples of the carrier gas include inert gases and hydrogen. In this example, a single precursor provides all the necessary oxygen, silicon, and carbon, including the carbon-carbon triple bonds and other functional groups if present. As indicated, siloxanes and various silanes or compounds having silyl groups with hydrocarbon oxy moieties are suitable for this purpose. Examples of precursors that may be used in such process gases are POTMS, DTDS, DMMOSA, MDMOSA, DMEOSA, MDEOSA and EDEOSA.

In a second process gas example, the carrier gas supplies some or all of the oxygen. As indicated, examples of suitable oxygenated carrier gases are carbon dioxide, ozone, hydrogen peroxide, molecular oxygen or other oxygen containing molecules. In this third example, only a single precursor is employed. It may or may not include oxygen. In cases where no oxygen is used, it could simply be a hydrocarbon silane material involving one carbon-carbon triple bond. Examples of suitable precursors for this embodiment include ETMS or TMSA, PTMS, BTMSA, TAS, MSTA, MDEOSA, DMEOSA, DMSDA and VTMS. Any one of these single precursors may be used in conjunction with a carrier gas.

In a third example of a process gas, oxygen is again supplied in a carrier gas such as carbon dioxide, oxygen, ozone, nitrous oxide, or hydrogen peroxide. However, in this case two or more precursors are employed. At least one of these may be similar to those identified in the second example. However, it is not necessary for oxygen to be present in either the primary or secondary precursors. However, in some embodiments, some amount of oxygen may be present in one or more of these molecules. Many relatively simple hydrocarbon silanes and/or silyl compounds may be employed as the primary precursor.

The methods of the present invention are not limited to the above examples of process gas compositions. In general, the process gas includes a carrier gas, an optional oxidant(s) (if not included in the carrier gas or the silicon-containing precursor) and the desired silicon and organic functional groups in one or more precursors. In particular embodiments, the process gas consists essentially of a carrier gas of $CO_2$ and inert gas (e.g., $CO_2$+He), a small amount of oxygen and a single organic precursor.

As indicated above, in certain embodiments, the process gas employs a single silicon-containing precursor in addition to the carrier gas and an optional oxidant, e.g., the process gas may consist essentially of a silicon-containing precursor that also contains the desired functional group(s), an optional oxidant (if necessary) and a carrier gas. In a particular embodiment, the process gas comprises a silicon-containing precursor that also contains a carbon-carbon triple bond, an optional oxidant, and a carrier gas. The process gas may consist essentially of these gases. Particular examples include TMSA/oxidant/carrier gas and BTMSA/oxidant/carrier gas. Of course, as explained above, the carrier gas may include the oxidant. As discussed above, the methods of the invention produce ULK films deposited using a single precursor that have properties comparable to porous ULK films deposited using dual (backbone and porogen) precursors.

PECVD Deposition

Various deposition techniques may be employed to form the CDO dielectric materials of this invention. These include various other forms of chemical vapor deposition (CVD) including plasma enhanced CVD (PECVD) and high-density plasma CVD (HDP CVD). HDP CVD of dielectric materials is described in various sources including U.S. Pat. No. 6,596,654, which is incorporated herein by reference for all purposes. Additionally, other techniques such as spin on techniques and deposition from supercritical solutions may be employed. But for many applications of this invention, a plasma based CVD process is employed.

Further the deposition conditions may be optimized to promote the crosslinking of incorporated bonds. Without this crosslinking, the film mechanical strength will generally be low due to the fact that an increase in content of methyl group $CH_3$ as a terminating group in the CDO film will reduce the bonding density per volume thus the bonding integrity of the film. With crosslinking, the Si—O—Si matrix structure is strengthened. As a result, the mechanical strength, or the fracture toughness, of the as deposited CDO film will be high.

Compositional bonds formed in CDO film of particular interest to this invention include Si—$CH_2$—Si, Si—C≡C—Si, Si—CH=CH—$S_1$, Si—$CH_2$—$CH_2$—Si and other derivatives of these bonds due to Si, C or O crosslinking, such as Si—O—C=C—Si, Si—O—CH=CH—Si, Si—C(—H, —OSi)—$CH_2$—Si, etc. It is noted that the chemical bond length and angle varies with the degree of saturation and crosslinking. Nominal bond length of the C—C bond is ~1.5 Å, that of the C=C bond is ~1.3 Å, that of the CC bond is ~1.2 Å, and that of the C—O bond is ~1.1 Å while the nominal bond length of the Si—O bond is ~1.6 Å and that of the Si—C bond is ~1.9 Å. It is evident that the incorporation of C≡C bond and its derivatives (C=C, C—C) and their crosslinking within the CDO film will greatly influence the Si—O—Si matrix structure. More specifically, the Si—O—Si bond angle will change significantly as the desired C related bonds are incorporated and crosslinked. Since the Si—O—Si matrix is the backbone structure of the CDO film, the change in Si—O—Si bond angle will increase the nanometer scale pore space in the matrix and thereby decrease the dielectric constant in the matrix.

Residual stress can be reduced by incorporating C≡C bonds and its derivatives and promoting cross-linking/bridging in the CDO film. To further enhance its incorporation and its crosslinking within the CDO film, one method is to increase ion bombardment during the PECVD deposition. Process conditions that increase ion bombardment may be chosen to increase one or both of (a) the mean energy of ion striking the substrate and (b) the flux of ions reaching the substrate. Physically, these results may be achieved by selecting process conditions that accomplish one of the following: (i) increasing the mean free path of the ions in the plasma, (ii) reducing the distance that an ion must travel before striking the substrate, and (iii) increasing the mean energy or momentum of the ions that strike the substrate surface.

To increase the momentum or energy of ions striking the substrate surface, at least two different process conditions may be manipulated. First, using a dual-frequency reactor of the type described below, one can increase the relative amount of the low frequency component of the RF energy supplied to the reactor. This has the effect of increasing the length of time in a given oscillation during which ions are accelerated in a single direction (toward the wafer surface). Because the ions are exposed to a field in this direction for a longer period of time, they can accelerate to higher speeds and hence strike the substrate with greater momentum. Second, one can pulse the high frequency component of the RF power to accomplish a similar result.

As is well known in the art, in general, high frequency components of the RF power delivered to a reactor control the plasma density and low frequency components produce ion bombardment of the film. The high and low frequency components can be provided at any of a number of suitable frequencies. In a typical process, the LF component is provided in a frequency range of about 100 to 600 kHz, more preferably about 200-500 kHz, for example about 300 kHz. The High Frequency HF component is generally between 2-60 MHz~in one process example, an HF frequency of 13.156 MHz is used.

In one embodiment, the low frequency component of delivered RF power is between about 0 and 90 percent of the total power, and more preferably between about 0 and 60 percent of the total power (e.g., between about 5 and 40 percent). The optimal value will vary depending upon the mean free path of the ions and the various conditions that impact mean free path. In a specific example, the total power delivered is about 800 Watts on 6 200 mm wafers or 0.42 W/cm$^2$ in area density. This value can be varied depending upon the specific application and plasma reactor employed. In many cases, the low frequency component has a power area density of between about 0 W/cm$^2$ and 20 W/cm$^2$, and more preferably between 0 W/cm$^2$ and 1 W/cm$^2$.

In addition to varying the ratio of HFRF to LFRF, the HFRF power may be pulsed at a certain duty cycle, for example pulsing at between 500 Hz and 10 kHz and varying the HFRF duty cycle from 20-80%. This effectively superimposes a low frequency component on the plasma generation power.

Another method that may be used to increase ion bombardment during film deposition is to alter the deposition pressure. This simply increases the mean free path of ions in the deposition chamber. In one embodiment of the invention the deposition pressure is maintained at a pressure of between about 0.5 to 20 Torr, more preferably in the range of about 2-10 Torr.

Still another adjustment that may be used involves varying the gap between the two capacitor plates of the plasma reactor. In the apparatus described below, this involves choosing an appropriate gap between the showerhead (one capacitor plate) and a thermal block (a second capacitor plate) on which the wafer is positioned, thereby reducing the distance between the plasma source and the substrate. This reduces the distance that an ion must travel before striking the substrate. The ideal gap depends on the type of reactor employed and the process conditions. For most situations, the gap is preferably between about 3 and 20 millimeters.

Process optimization also includes setting the proper flow rates of the various compounds in the process gases. Note that the flow rates are chosen depending upon the amount of surface area to be covered. One can scale the flow rates chosen depending upon variations in the area to be deposited, including in situations where the reactor employs fewer or greater number of wafers and possibly employs 300 millimeter wafers as opposed to 200 millimeter wafers. For example, in experiments where six 200 millimeter wafers were used, the total precursor flow rate was 0.5 ml/min to about 10 ml/min. Note that this comprises the total flow rate of all precursors.

The deposition temperature can be tailored to meet the application. For some IC fabrication applications involving copper lines, for example, temperatures below 425 C may be required for intermetal dielectric deposition. In some embodiments, the substrate temperature is maintained between about 300 and 425 C (preferably between about 300 and 350 C) during CDO film deposition.

It should be noted that many dual precursor ULK deposition processes require relatively low temperatures so that the porogen may be deposited. Another advantage of single precursor ULK deposition is that high temperature deposition may be used. As discussed further below, this reduces or eliminates post-deposition out-gassing.

UVTP Process

After the film is deposited as described above, the as-deposited film undergoes a UV cure to produce the ULK films of the present invention. The UV source employed may be of any type, including lasers and lamps. Examples of lamps include a mercury lamp and a xenon arc lamp. These generally emit UV radiation over a relatively wide range of wavelengths. Lasers, on the other hand, typically emit UV radiation at a single wavelength or a very narrow band of wavelengths. Examples of lasers include excimer lasers and tunable variations. In the reactor or UVTP chamber, the UV radiation should be directed onto the wafer. Various lenses, filters, and other optical elements may be employed for this purpose. In some embodiments, the optical elements will expand a beam of UV light to cover an entire wafer. In other embodiments, the UV radiation will form a line or patch that illuminates only a portion of the wafer. In such cases, the light and the wafer can be moved with respect to one another to ensure that the whole wafer surface is illuminated over a relatively short period of time. In a particular embodiment, a thin strip of light from a laser or other source is directed onto the wafer. Then the wafer and the strip of light are moved with respect to one another to ensure that the entire wafer is illuminated. An example of a suitable apparatus in accordance with the invention will be presented below.

In general, temperatures below about 450 degrees C. are preferable, more preferably ≦400 degrees C., as higher temperatures can damage a partially fabricated device, particularly one that employs copper lines. Typical temperatures range between about room temperature (i.e., 20 degrees C.) up to 450 degrees C., and typically between about 25° C. to 450 C. It should be noted that exposure to UV radiation can itself contribute to substrate heating.

Chamber pressures also can range broadly depending on the precursor and the nature of the UV treatment. For example, appropriate pressures may span a range of between about 10$^{-6}$ Torr (high vacuum) to 1000 Torr. In the higher pressure ranges, it is important to ensure that moisture, oxygen, or any other undesirable species is kept out of the chamber, with the exception of processes that may want ozone or excited oxygen. In a particular pressure range when using inert gas, the pressure ranges from about 1 mTorr to 100 Torr.

UV exposure time is largely a function of both the lamp intensity and thickness of the precursor layer, as well as the desired modulus. Lamp intensities range from about 1 mW/cm$^2$-50 mW/cm$^2$ (with 50 mW/cm$^2$ at about 100% intensity).

For example, for a 2 kÅ film, curing times may range from about 1-10 minutes, e.g., about 3 minutes, at 100% UV intensity. A typical 3 minute cure process for a 2 kÅ film will result in a modulus of about 10 GPa.

It is also important not to overexpose the film to UV radiation; as discussed further below, the UV cure lowers the dielectric constant, e.g., by increasing the amount of Si—CH$_2$—Si and Si—CH$_3$ but overexposure will result in higher dielectric constants because of reduction of Si—CH$_3$. For commercial applications, shorter exposure times are preferred. In a preferred embodiment, the exposure time ranges from about 1 second up to 5 minutes, e.g., 1-2 minutes.

Dielectric Constant and Mechanical Strength

As discussed above, it desirable to have low dielectric constant without sacrificing mechanical strength. One approach to reducing the dielectric constant is to introduce more free space (pores) within the film; however, at a certain point, the introduction of too many pores results undesirable properties such as a reduction in mechanical strength and penetration of chemicals.

In addition to porosity, dielectric constant is a function of the degree of dipolarization. The dielectric constant is a frequency-dependent, intrinsic material property. The constant can be contributed from three components that result from electronic, ionic and dipolar contributions. Si—CH$_3$ and Si—CH$_2$—Si bonds terminate the O—Si—O bonding network, causing a decrease in film density. In addition, Si—CH$_3$ and Si—CH$_2$—Si reduce the ionic and dipolar contributions to lower the dielectric constant. In general, dielectric constant decreases with increasing Si—CH$_3$ and Si—CH$_2$—Si content.

UV curing improves cross-linking and lowers the dielectric constant, producing ULK films that have high mechanical strength. This is significant as UV curing does not lower the dielectric constant for all materials~for materials with different bonding structures, the dielectric constant would be raised by the application of UV radiation. Reduced dielectric constant is observed for the particular precursors described above, e.g., organosilicon precursors having carbon-carbon triple bonds. It is believed that this is due to several factors. First, there is an increase in free space and pore size due to UV cure. In particular, an increase in pore size from about 1.0 nm to about 1.27 nm is observed for a film deposited using TMSA. Pore size is believed to increase from the conversion of Si—$CH_3$ groups. In depositing TMSA-based films, for example, some of the deposited Si—$CH_3$ bonds are cross-linked to form Si—$CH_2$—Si, which is believed to the lower the dielectric constant by enlarging the pore size. Further, there may be organic compounds in the matrix that are driven out by UV cure. For example, in depositing TMSA (Si—C≡ functional group), some CC may remain in OSG matrix that can be removed by UV treatment, creating more free space. Similarly, in depositing 3-(trimethylsilyl)cyclopentene (Si—$C_xH_y$) functional group), a certain amount of cyclopentene remaining in OSG matrix may be removed by UV treatment; in depositing phenoxytrimethylsilane (Si—$C_xH_yO_z$ functional group) may be removed by UV treatment; and in depositing phenyldimethylethoxysilane (Si—C≡), some phenyl groups may remain in OSG matrix that can be removed by UV treatment.

Finally, as explained above, the introduction of Si—$CH_2$—Si and Si—$CH_3$ (as opposed to Si—O bonds) bonds reduces the dipolar and ionic contributions to the dielectric constant.

From an integration point view, introducing more Si—$CH_2$—Si and Si—$CH_3$ to reach k of less than or equal to about 2.50 is preferable to increasing porosity after a certain point due to the effects of increased porosity on mechanical strength and diffusion. This is one reason that the single precursor methods of producing ULK films described herein are advantageous for some applications over dual precursor backbone network former+porogen methods.

According to various embodiments the methods of the invention may be used to fabricate ULK CDO films having k values of between about 2.5 and 2.7, e.g., about 2.5, 2.55, 2.6, 2.65 and 2.7.

Figure 2:
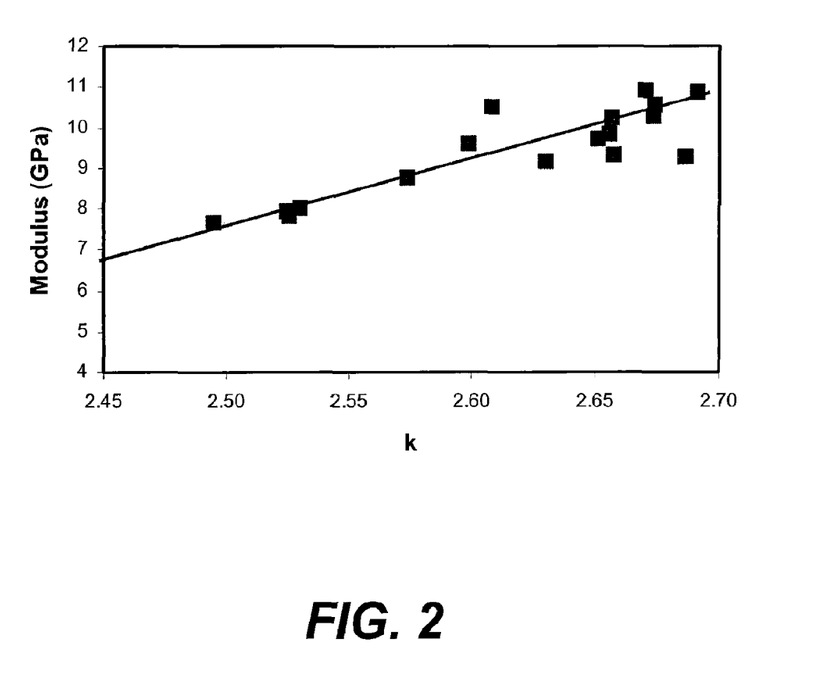
FIG. 2 is a graph showing film modulus as a function of film dielectric constant for single precursor ULK materials.

FIG. 2 presents film modulus as a function of k value for single-precursor based dense films deposited by PECVD and cured by UVTP in accordance with a method of the invention. To deposit these films, a TMSA, $CO_2$ and $O_2$ process gas was used, followed by a UVTP process using 80-100% UV intensity and a substrate temperature of 360-400 C. The films were exposed to the UV radiation for times ranging from 3-30 minutes depending on film thickness.

Films ranging with dielectric constants between about 2.5 and 2.75 and modulus between about 7.5 and 12 GPa can be achieved using the methods of the present invention as shown in FIG. 2. Also as observed, modulus increases with the dielectric constant. However, at a dielectric constant of 2.5, modulus of 7.5 GPa can be achieved—film performance is comparable to that of dual precursor ULK methods.

Figure 3:
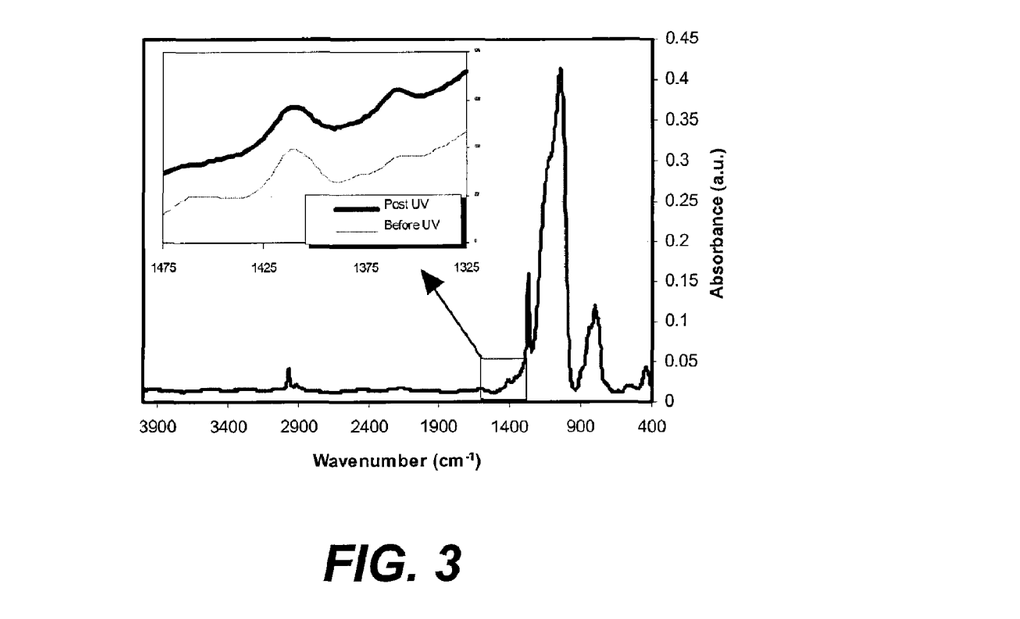
FIG. 3 shows FTIR spectra of a single-precursor as-deposited and post UV cured films.

FIG. 3 shows FTIR spectra of the single-precursor, k of 2.5 film with a spectral comparison of the as-deposited and post UV cured in the range of 1325-1475 $cm^{-1}$ (inset). The spectra were normalized by film thickness. The absorption at 1359 $cm^{-1}$ is assigned to the bonding of C—H in Si—$CH_2$—Si crosslinks while the absorption at 1411 $cm^{-1}$ is assigned to the bending of C—H in Si($CH_3$)$_x$ as shown inset of FIG. 3. Calculations presented in Table 1 show that Si—$CH_2$—Si peak area increases by 189% compared with that of the as-deposited film while Si—$CH_3$ peak area decreases by 19% after UV curing, which indicates that crosslinks increase significantly after UVTP. Moreover, the peak area ratio of Si—$CH_2$—Si/ SiCH$_3$ increases from 9.8% to 34.9% after UVTP, which is believed to cause significant improvement of film mechanical strength.

TABLE 1

Difference in FTIR peak area of SiCH$_3$ and Si—$CH_2$—Si without and with UV Curing

|  | SiCH$_3$(1) | Si—$CH_2$—Si(2) | 2/1 (%) |
|---|---|---|---|
| Without UV (Peak area) | 0.184 | 0.018 | 9.8% |
| With UV (Peak area) | 0.149 | 0.052 | 34.9% |
| Difference |  | −19% | +189% |

Pore Size and Interconnectivity

Figure 4:
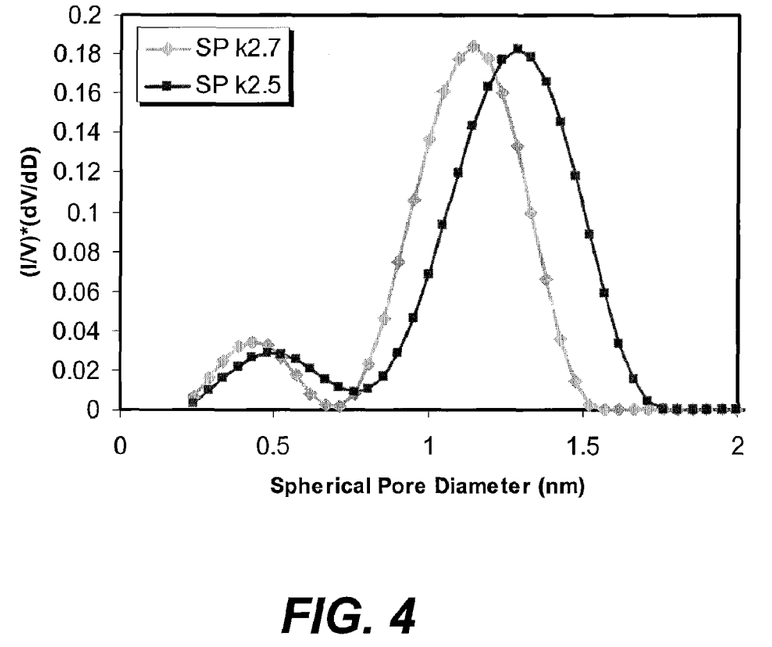
FIG. 4 is a graph showing pore size distribution of two single precursor ULK films produced, one having a k-value of 2.5 and one having a k-value of 2.7.

Pore size of the films produced by methods of the invention typically range from about 0.75-1.75 nm in diameter, with average pore size between about 1.15-1.27 nm in diameter. As indicated above, dielectric constant is related to the porosity of the film, including pore size. FIG. 4 shows pore size distributions for two films produced by methods of the invention using TMSA as a precursor, one having a k of 2.5 and one having a k of 2.7 as measured by a Positronium Annihilation Lifetime Spectroscopy (PALS) analysis. As can be seen from the figure, the film having a k of 2.5 has larger pores, with a peak in the distribution of about 1.27 nm compared to the peak of the k2.7 film of about 1.15 nm. Without UV curing, the distribution peaks at about 1.0 nm.

The methods of the present invention produce films having zero interconnectivity. Interconnectivity refers to the degree to which the pores are interconnected. In most cases, porogen-based films have high interconnectivity (typical interconnectivities of porogen-based films range from about 5-20 nm) while films of the produced by the PECVD/UVTP methods described herein have zero interconnectivity as measured by a PALS analysis of the low-k films. The films produced by the methods of the invention also have lower average pore size, with average pore size of porogen-based films around 1.5 nm. Zero interconnectivity and lower pore size results in mechanically stronger films, as well as low diffusion coefficients, as explained below.

Diffusion Coefficient

The introduction of more pores within film (e.g., using a porogen) could result in penetration of chemicals addition the reduction in mechanical strength discussed above. Gas-phase precursors have a tendency to infiltrate the porous dielectric during chemical vapor deposition or atomic layer deposition processes of subsequent IC fabrication operations. The penetration of metallic species or solvents during integration could damage the electric properties of the ULK dielectrics.

The ULK films of the present invention have low diffusion coefficients. This is due to several factors. First, the films of the present invention are closed pore (zero interconnectivity). Porogen based processes of producing ULK films may produce open pore films with channels that connect pores. The films also have smaller pores.

Figure 5:
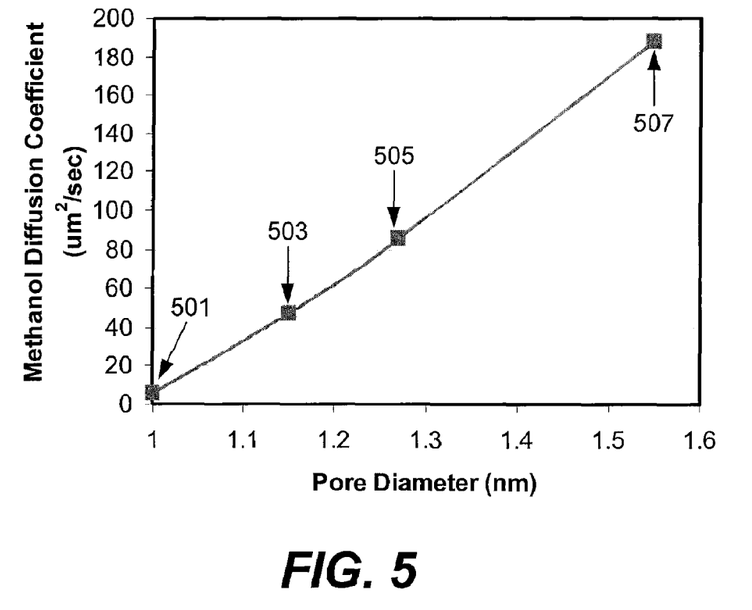
FIG. 5 is a graph showing methanol diffusion as a function of pore size.

Organic solvent molecular probes were used for characterizing the single precursor ULK films of the present invention through ellipsometirc porosimetry. Due to the relative lower density and larger free space compared to the to dense CDO (k of 3.0) films, the solvent coefficient for single precursor ULK films is higher than that of k3.0 CDO films. However, experimental results show that solvent diffusion coefficient of the single precursor ULK film is much lower than that of the porogen based ULK film. At least some of this effect may be attributed to the shorter or zero interconnection length and smaller pore size for single-precursor ULK films. FIG. 5 is a graph showing methanol diffusion as a function of pore size. Reference number 501 indicates dense CDO film (HM-Coral), reference number 503 indicates k2.7 film produced by a PECVD/UVTP method, reference number 505 indicates k2.5 film produced by a PECVD/UVTP method, and reference number 507 indicates k2.5 film deposited by a dual precursor porogen-based process.

As can be seen from the figure, while the SP-ULK film has a higher diffusion coefficient than that of the denser films. However, it favorably compares to the dual precursor film having the same dielectric constant.

Out-Gassing

Figure 6:
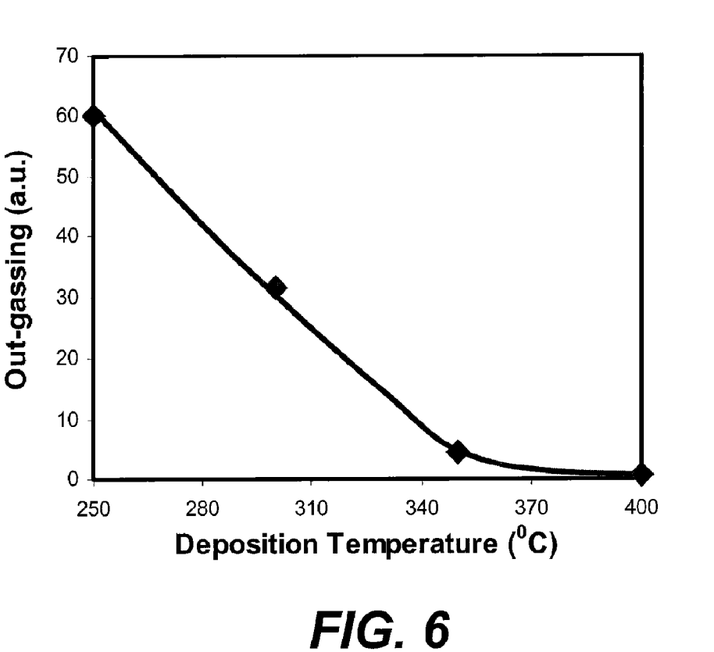
FIG. 6 is a graph showing hydrocarbon out-gassing of ULK as a function of deposition temperature.
Figure 7:
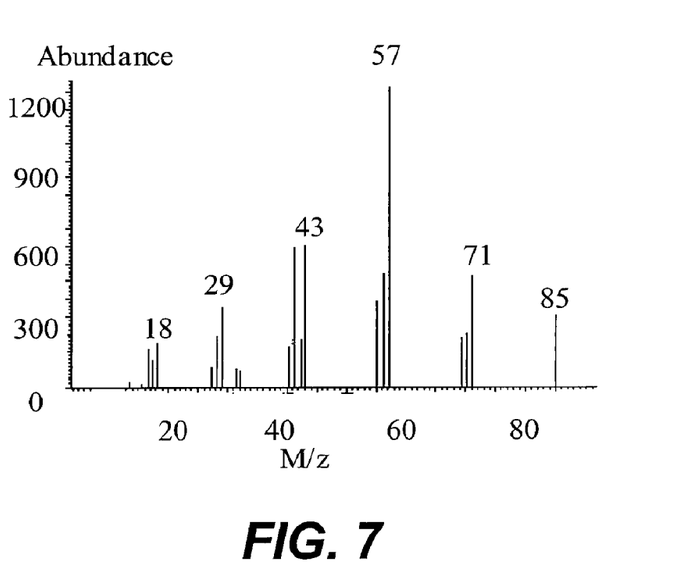
FIG. 7 is mass spectra showing out-gassed species.

Another advantage to the single precursor ULK methods described herein is reduced out-gassing. Out-gassing refers to gaseous species that the leave the dielectric film subsequent to deposition—oftentimes at the high temperatures required in subsequent processing steps. FIG. 6 shows out-gassing as a function of deposition temperature for ULK films formed by single precursor PECVD/UVTP methods (out-gassing was measured subsequent to deposition and cure). As shown in the figure, large decreases in hydrocarbon out-gassing were observed for films deposited at higher temperatures. Very little or no out-gassing was observed for the single precursor CDO films deposited at 350-400 C was observed. FIG. 7 is a mass spectra showing the out-gassed species. Most species are —$C_nH_{2n+1}$ groups, which are bonded to the backbone during plasma polymerization at relatively low deposition temperatures, e.g., during porogen based deposition processes. However, these hydrocarbon groups are not stable enough to stay inside the matrix if using high deposition temperatures, resulting in a much lower level of out-gassing for films deposited at high temperature.

EXAMPLES

As indicated above, the methods of the invention may be used to deposit CDO films having various dielectric constants, e.g., ranging from 2.5 to 2.7. An example of a single precursor process gas and conditions that may be used to deposit a film having k2.5 and a film having k2.7 follow:

|  | k2.5 | k2.7 |
| --- | --- | --- |
| Organosilicon Precusor (single precursor) | TMSA vapor | TMSA vapor (low TMSA flow) |
| PECVD Deposition Temperature and Pressure | 350 C. and 7 Torr | 350 C. and 7 Torr |
| UV Cure Intensity | 100% | 100% |
| UV Cure Temperature | 400 C. | 400 C. |
| UV Cure Time | 3-20 min (2-10 k Angstrom film) | 2-15 min (2-10 k Angstrom film) |
| Resulting Modulus | 7.5 GPa | 11 GPa |

As can be seen from the table above, k-value may be controlled in part by adjusting the flow rate of precursor used, with high TMSA flow resulting a lower k-value.

Apparatus

The present invention can be implemented in many different types of apparatus, such as chemical vapor deposition (CVD) reactors and spin-coating systems. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing dielectric deposition is transferred from one station to another within the reactor during the process. While in process, each wafer is held in place by a pedestal, wafer chuck and/or other wafer holding apparatus. For certain operations in which the wafer is to be heated, the apparatus may include a heater such a heating plate. In a preferred embodiment of the invention, a PE-CVD (Plasma Enhanced Chemical Vapor Deposition) system may be used as well as, for example, an HDP CVD (High Density Plasma Chemical Vapor Deposition) system.

Figure 8:
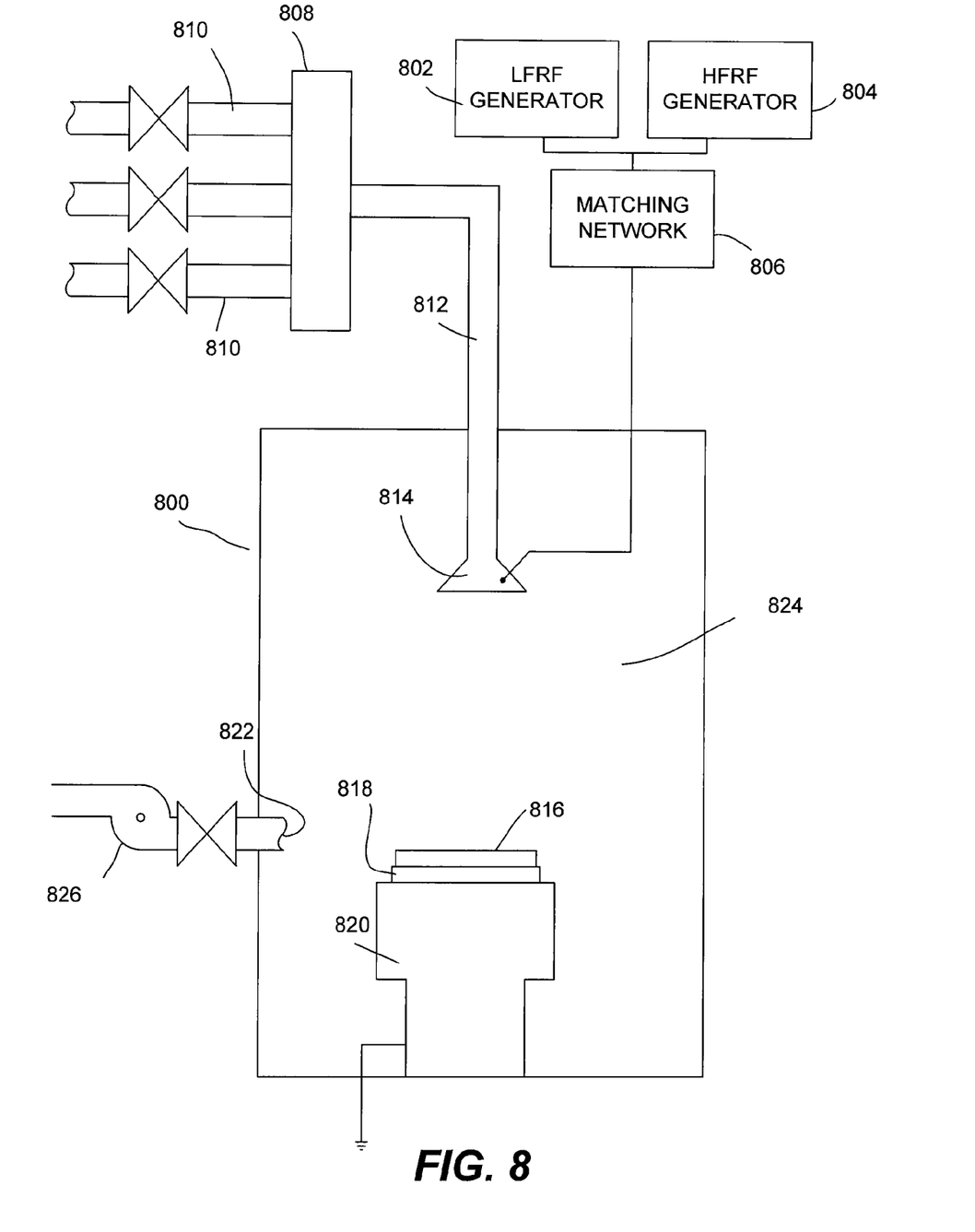
FIG. 8 is a simple block diagram depicting various reactor components arranged as in a conventional reactor.

FIG. 8 provides a simple block diagram depicting various reactor components arranged for implementing the present invention. As shown, a reactor 800 includes a process chamber 824, which encloses other components of the reactor and serves to contain the plasma generated by a capacitor type system including a showerhead 814 working in conjunction with a grounded heater block 820. A high-frequency RF generator 802 and a low-frequency RF generator 804 are connected to a matching network 806 that, in turn is connected to showerhead 814. The power and frequency supplied by matching network 806 is sufficient to generate a plasma from the process gas, for example 800 W total energy.

Within the reactor, a wafer pedestal 818 supports a substrate 816. The pedestal typically includes a chuck, a fork, or lift pins to hold and transfer the substrate during and between the deposition reactions. The chuck may be an electrostatic chuck, a mechanical chuck or various other types of chuck as are available for use in the industry and/or research.

The process gases are introduced via inlet 812. Multiple source gas lines 810 are connected to manifold 808. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 800 via an outlet 822. A vacuum pump 826 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Figure 9:
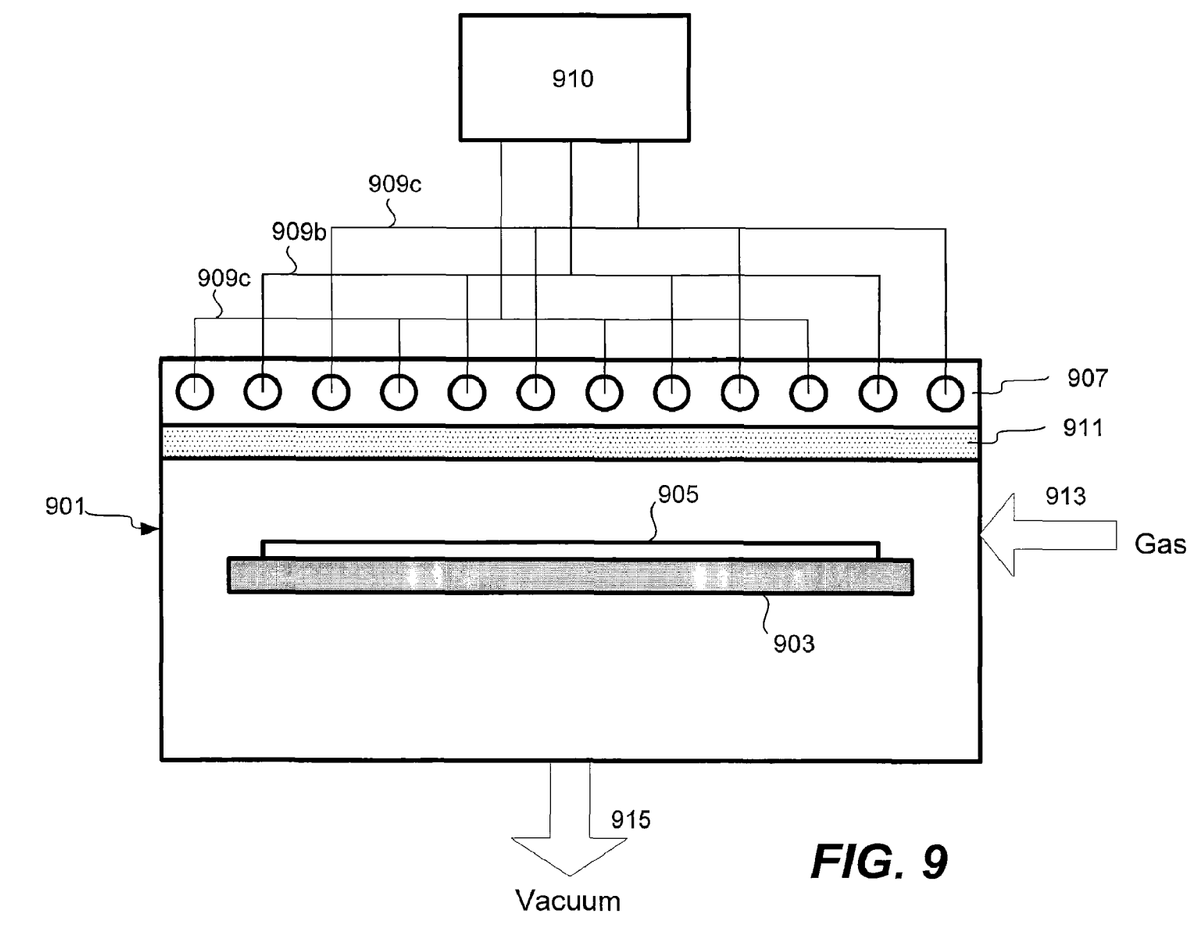
FIG. 9 is an example of UV cure chamber that may be used in accordance with certain embodiments of the invention.

FIG. 9 is a schematic diagram of an example UVTP chamber 901 in accordance with the invention. Chamber 901 is capable of holding a vacuum and/or containing gases at pressures above atmospheric pressure. For simplicity, only one chamber 901 is shown. It is noted that in many embodiments, chamber 901 is one chamber in a multi-chambered apparatus (entire apparatus not shown), although chamber 901 could alternatively be part of a stand-alone single chambered apparatus. Suitable multi-chambered apparatus, for example, include the modified Novellus Sequel and Vector systems.

A substrate holder 903 secures a wafer 905 in a position such that light from a UV light source array 907 can irradiate wafer 905. Substrate holder 903 can have a heater (not shown) that can heat the substrate to defined temperatures, or could be cooled using a chiller and can be controlled by a temperature controller (not shown). Chamber 901 is configured with a gas inlet 915, which is connected to a gas source (not shown), and with a vacuum outlet 913, which is connected to a vacuum pump (not shown). The amount of gas introduced into the chamber 901 can be controlled by valves and mass flow controller (not shown) and pressure is measured by pressure gauge (not shown).

In this example, the UV light source array 907 is mounted outside the chamber 901. In alternate embodiments, the UV light source array may be housed inside the chamber 901. UV light source array 907 includes an array of individual UV sources such as mercury vapor or xenon lamps. Note that the invention is not limited to mercury vapor or xenon lamps as UV light sources and other suitable light sources include deuterium lamps or lasers (e.g., excimer lasers and tunable variations of various lasers). Various optical elements, such as reflectors, may be required to direct the UV light toward portions of the substrate. Methods for directing the light at different portions of the substrate at different times may be required as well. A scanning mechanism may be used for this purpose. A window 911 made of quartz, sapphire or other suitable material is positioned between UV light source array 907 and wafer 905 to provide vacuum isolation. Filters can also be used to remove unwanted spectral components from particular sources to "tune" the sources.

The UV light source array 907 may be comprised of one or more types of UV sources, for example an array of three types of UV sources, each type providing UV radiation with a different wavelength distribution. The UV sources are electrically connected to each other (909a, 909b and 909c) and controlled by control system 910, which controls when each of the various UV sources is illuminated. Control system 910 is typically, but not limited to, a computer processing system such as a PC or workstation. Of course, any number and types of individual light sources in any suitable configuration can be used.

Note that the light source array and control configuration of FIG. 9 is only an example of a suitable configuration. In general, it is preferable that the lamps are arranged to provide uniform UV radiation to the wafer. For example, other suitable lamp arrangements can include circular lamps concentrically arranged or lamps of smaller length arranged at 90 degree and 180 degree angles with respect to each other may be used. The light source(s) can be fixed or movable so as to provide light in appropriate locations on the wafer. Alternatively, an optical system, including for example a series of movable lenses, filters, and/or mirrors, can be controlled to direct light from different sources to the substrate at different times.

The UV light intensity can be directly controlled by the type of light source and by the power applied to the light source or array of light sources. Factors influencing the intensity of applied power include, for example, the number or light sources (e.g., in an array of light sources) and the light source types (e.g., lamp type or laser type). Other methods of controlling the UV light intensity on the wafer sample include using filters that can block portions of light from reaching the wafer sample. As with the direction of light, the intensity of light at the wafer can be modulated using various optical components such as minors, lenses, diffusers and filters. The spectral distribution of individual sources can be controlled by the choice of sources (e.g., mercury vapor lamp vs. xenon lamp vs. deuterium lamp vs. excimer laser, etc.) as well as the use of filters that tailor the spectral distribution. In addition, the spectral distributions of some lamps can be tuned by doping the gas mixture in the lamp with particular dopants such as iron, gallium, etc.

It should be understood that the apparatus depicted in FIG. 9 is only an example of a suitable apparatus and other designs for other methods involved in previous and/or subsequent processes may be used. Other examples of apparatus suitable for implementing the present invention are described in commonly assigned co-pending application Ser. Nos. 11/115,576 filed Apr. 26, 2005, 10/800,377 filed Mar. 11, 2004, and 10/972,084 filed Oct. 22, 2004, incorporated by reference herein.

Other Embodiments

While this invention has been described in terms of certain embodiments, there are various alterations, modifications, permutations, and substitute equivalents, which fall within the scope of this invention. It should also be noted that there are many alternative ways of implementing the methods and apparatuses of the present invention. Further, there are numerous applications of the present invention, both inside and outside the integrated circuit fabrication arena. It is therefore intended that the following appended claims be interpreted as including all such alterations, modifications, permutations, and substitute equivalents as fall within the true spirit and scope of the present invention.

What is claimed is:

1. A method of preparing a low-k doped silicon oxide (CDO) film on a substrate, the method comprising:
   providing the substrate to a deposition chamber;
   contacting the substrate with a process gas comprising a silicon-containing precursor having a carbon-carbon triple bond and a carrier gas to thereby deposit a solid CDO film containing carbon-carbon triple bonds on the substrate via a dual RF frequency PECVD reaction, wherein the process gas contains no more than one hydrocarbon-containing precursor; and
   exposing the deposited film to UV radiation in a manner that improves cross-linking and lowers the dielectric constant of the film.

2. The method of claim 1 wherein the dielectric constant of the film is between about 2.5 and 2.7.

3. The method of claim 1 wherein the dielectric constant of the film is less than or equal to about 2.5.

4. The method of claim 1 wherein after exposing the deposited film to UV radiation, the deposition film has a pore diameter distribution having a peak between about 1.15-1.30 nm.

5. The method of claim 1 wherein the process gas consists essentially of an organo-silicon precursor, an optional oxidant and a carrier gas.

6. The method of claim 5 wherein the process gas contains an oxidant selected from: molecular oxygen ($O_2$), ozone ($O_3$), hydrogen peroxide ($H_2O_2$), nitrous oxide ($N_2O$) and carbon dioxide ($CO_2$).

7. The method of claim 1 wherein the silicon-containing precursor is selected from: Trimethylsilaneacetylene (TMSA), Bis(trimethylsilyl)acetylene, (BTMSA), Propargyltrimethylsilane (PTMS), Propargyloxytrimethylsilane (POTMS), 1,3-Diethynyltetramethyldisiloxane (DTDS), Dimethylmethoxysilaneacetylene (DMMOSA), Methyldimethoxysilaneacetylene (MDMOSA), Dimethylethoxysilaneacetylene (DMEOSA), Methyldiethoxysilaneacetylene (MDEOSA), Ethyldiethoxysilaneacetylene (EDEOSA), Dimethylsilane-diacetylene DMSDA, Methylsilane-triacetylene (MSTA) and Tetraacetylene Silane (TAS).

8. The method of claim 1 wherein in the silicon-containing precursor is selected from Trimethylsilaneacetylene (TMSA), Bis(trimethylsilyl)acetylene, (BTMSA).

9. The method of claim 1 wherein a $CH_2$—Si—$CH_2$/Si—$CH_3$ FTIR peak area ratio of the deposited film is at least about 15% after exposing the film to UV radiation.

10. The method of claim 1 wherein a $CH_2$—Si—$CH_2$/Si—$CH_3$ FTIR peak area ratio of the deposited film is at least about 20% after exposing the film to UV radiation.

11. The method of claim 1 wherein a $CH_2$—Si—$CH_2$/Si—$CH_3$ FTIR peak area ratio of the deposited film is at least about 30% after exposing the film to UV radiation.

12. The method of claim 1 wherein the deposited film has a pore interconnectivity of about zero.

13. The method of claim 1 wherein there is substantially no out-gassing for the deposited film.

14. The method of claim 1 wherein the methanol diffusion coefficient is less than about 100 $\mu m^2$/sec.

15. A method of preparing a low-k doped silicon oxide (CDO) film on a substrate, the method comprising:
    providing the substrate to a deposition chamber;
    contacting the substrate with a process gas comprising a silicon-containing precursor having a carbon-carbon triple bond and a carrier gas to thereby deposit a CDO film containing carbon-carbon triple bonds on the substrate via a dual RF frequency PECVD reaction; and
    exposing the deposited film to UV radiation to thereby lower the dielectric constant to no more than about 2.7 and increase a Young's modulus of the film.

16. The method of claim 15 wherein the modulus is increased to at least about 12 GPa.

17. The method of claim 15 wherein the dielectric constant is lowered to no more than about 2.6 and the modulus is increased to at least about 9 GPa.

18. The method of claim 15 wherein the dielectric constant is lowered to no more than about 2.5 and the modulus is increased to at least about 7 GPa.

19. The method of claim 15 wherein the process gas contains no more than one hydrocarbon precursor.

20. The method of claim 15 wherein the process gas does not contain a porogen.

21. The method of claim 15 wherein the film is deposited at a temperature of about 350-400 C.

22. The method of claim 15 wherein the precursor is selected from BTMSA and TMSA.

23. The method of claim 15 wherein exposing the film to UV radiation increases the $CH_2$—Si—$CH_2$/Si—$CH_3$ FTIR peak area ratio by at least about 100%.

* * * * *